(12) United States Patent
Ogawa

(10) Patent No.: US 7,057,279 B2
(45) Date of Patent: Jun. 6, 2006

(54) HIGH-FREQUENCY CIRCUIT BLOCK, ITS MANUFACTURING METHOD, HIGH-FREQUENCY MODULE DEVICE, AND ITS MANUFACTURING METHOD

(75) Inventor: Tsuyoshi Ogawa, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 10/466,731

(22) PCT Filed: Nov. 19, 2002

(86) PCT No.: PCT/JP02/12081

§ 371 (c)(1),
(2), (4) Date: Jul. 18, 2003

(87) PCT Pub. No.: WO03/047325

PCT Pub. Date: Jun. 5, 2003

(65) Prior Publication Data

US 2004/0077124 A1 Apr. 22, 2004

(30) Foreign Application Priority Data

Nov. 26, 2001 (JP) .............................. 2001-359853

(51) Int. Cl.
*H01L 23/34* (2006.01)
(52) U.S. Cl. .................. 257/728; 257/723; 257/758
(58) Field of Classification Search ................ 257/723, 257/728, 758
See application file for complete search history.

(56) References Cited

U.S. PATENT DOCUMENTS

| 5,231,751 | A | | 8/1993 | Sorce | |
|---|---|---|---|---|---|
| 5,674,784 | A | * | 10/1997 | Jang et al. | 438/692 |
| 6,583,364 | B1 | * | 6/2003 | Kurita et al. | 174/254 |
| 2001/0015327 | A1 | * | 8/2001 | Kitamura et al. | 206/204 |

FOREIGN PATENT DOCUMENTS

| EP | 540451 | 10/1991 |
|---|---|---|
| JP | 2000-36238 A | 2/2001 |
| JP | 2001-144218 A | 5/2001 |
| JP | 2001-298274 A | 10/2001 |

* cited by examiner

*Primary Examiner*—Long Pham
(74) *Attorney, Agent, or Firm*—Robert J. Depke; Trexler, Bushnell, Giangiorgi, Blackstone & Marr, Ltd.

(57) ABSTRACT

A high frequency module device having a high frequency circuit block unit including a passive device. A plural number of unit wiring layers, each formed by an insulating layer, having a passive device unit in its portion, and by a pattern wiring, are layered on a dummy substrate, and are released from the dummy substrate to form the high frequency circuit block unit (2), which is mounted on a motherboard (3). The major surfaces of the respective unit wiring layers are planarized. The passive device unit and the pattern wiring, formed on the major surface of each unit wiring layer in the high frequency circuit block unit (2), can be formed with high accuracy to improve high frequency characteristics. The high frequency circuit block unit (2) is not in need of a base substrate, thus achieves reduction in size and cost.

6 Claims, 21 Drawing Sheets

PRIOR ART

PRIOR ART

PRIOR ART

PRIOR ART

US 7,057,279 B2

HIGH-FREQUENCY CIRCUIT BLOCK, ITS MANUFACTURING METHOD, HIGH-FREQUENCY MODULE DEVICE, AND ITS MANUFACTURING METHOD

TECHNICAL FIELD

This invention relates to a high frequency circuit block unit, having a passive device, a manufacturing method therefor, a high frequency module device having the high frequency circuit block unit mounted on a motherboard, and a manufacturing method therefor.

This application claims priority of Japanese Patent Application No.2001-359853, filed on Nov. 26, 2001, the entirety of which is incorporated by reference herein.

BACKGROUND ART

A variety of the information, such as audio or video information, is converted into digital signals and handled as digital data, and hence may readily be handled by for example a personal computer or by a mobile computer. The above information may be compressed in bandwidth by an audio codec or video codec technology so as to be distributed by digital communication or digital broadcast to a variety of communication terminal equipment readily efficiently. For example, audio/video data (AV data) may be received outdoors by portable telephone sets.

The transmitting/receiving system for e.g., AV data has come to be variably used through the proposal of a network system usable in a small local area, including households. As the network system, the next-generation wireless radio communication systems of the 5 GHz range as proposed for example in IEEE 802.11a, wireless radio LAN system of the 2.45 GHz range as proposed for example in IEEE 802.11b or in the near-distance wireless communication system, termed Bluetooth, is now stirring up notice.

The transmitting/receiving system for e.g., data exploits the wireless network system effectively to enable exchange of variable data, access to the Internet or transmission/reception of data in variable locations, such as in households or outdoors, conveniently without the interposition of relaying devices.

In a transmitting/receiving system for e.g., data, development of a communication terminal equipment which is small-sized, lightweight and portable and which has the above-mentioned communication functions, is essential. In communication terminal equipment, high frequency analog signals need to be modulated/demodulated in the transmission/reception section. Thus, there is usually provided a high frequency transmission/reception circuit 100 by the superheterodyne system in which transmission/reception signals are once converted from the transmission/reception signals into signals of the intermediate frequency, as shown in FIG. 1.

The high frequency transmission/reception circuit 100 includes an antenna unit 101 having an antenna or a changeover switch for receiving or transmitting information signals and a transmission/reception switching unit 102 for switching between transmission and reception. The high frequency transmission/reception circuit 100 also includes a reception circuit unit 105 made up by a frequency conversion circuit section 103 and a demodulating circuit section 104. The high frequency transmission/reception circuit 100 includes a transmission circuit unit 109 made up by a power amplifier 106, a drive amplifier 107 and a modulating circuit section 108. The high frequency transmission/reception circuit 100 also includes a reference frequency generating circuit unit for supplying the reference frequency to the reception circuit unit 105 and to the transmission circuit unit 109.

The above-described high frequency transmission/reception circuit 100 is made up by an extremely large number of component parts, not shown in detail. These include large-sized functional parts, such as filters introduced between different stages, a local oscillator (voltage controlled oscillator or VOC), a SAW (surface acoustic wave) filter and passive component parts, such as inductance, resistance or capacitance components peculiar to high frequency analog circuits, including matching and bias circuits. Thus, the high frequency transmission/reception circuit 100 is large-sized in its entirety to prove hindrance to reduction in size and weight of the communication terminal equipment.

In communication terminal equipment, a high frequency transmission/reception circuit 110 by a direct conversion system, adapted for transmitting/receiving information signals without conversion to the intermediate frequency, as shown in FIG. 2, is also employed. In the high frequency transmission/reception circuit 110, the information signals, received by an antenna unit 111, are supplied via a transmission/reception switching unit 112 to a demodulating circuit unit 113 for direct baseband processing. In the high frequency transmission/reception circuit 110, information signals generated in a source are directly modulated in a modulating circuit unit 114, without conversion to an intermediate frequency, so as to be transmitted from an antenna unit 111 through an amplifier 115 and the transmission/reception switching unit 112.

In the above-described high frequency transmission/reception circuit 110, in which information signals are transmitted/received by direct detection without converting the information signals into intermediate frequency signals, the number of component parts, such as filters, may be reduced to simplify the overall structure to achieve a structure close to one chip. However, the high frequency transmission/reception circuit 100 needs to be matched to filters or matching circuits arranged on the downstream side. In the high frequency transmission/reception circuit 110, since the signals are amplified at a time in a high frequency stage, it becomes difficult to achieve a sufficient gain, so that the amplifying operation needs to be performed in the baseband unit. Thus, the high frequency transmission/reception circuit 110 is in need of a circuit for canceling DC offset, or redundant low-pass filters, thus further increasing the overall power consumption.

The conventional high frequency transmission/reception circuit is not of sufficient characteristics to satisfy required specifications, such as reduction in size or weight of the communication terminal equipment, whether the circuit is of the superheterodyne type or the direct conversion type. Thus, in the high frequency transmission/reception circuit, various attempts are being made for designing the circuit as a module with a small size by a simplified structure based on for example an Si-CMOS circuit. One of such attempts is to form passive devices of optimum characteristics on an Si substrate and to build a filter circuit or a resonator on an LSI (large-scale integrated circuit) and to integrate a logic LSI of the baseband section in an IC to produce a so-called one-chip high frequency substrate.

In this one-chip high frequency circuit substrate, it is crucial how to form an inductor unit 120 of high performance, as shown in FIGS. 3A and 3B. In this high frequency circuit substrate, a large recess 124 is formed in register with an inductor unit forming portion. 123 of an Si substrate 121 and an $SiO_2$ insulating layer 122. In this high frequency circuit substrate, a first wiring layer 125 is formed facing a recess 124, while a second wiring layer 126 is formed on the $SiO_2$ insulating layer 122 to form a coil section 127. In the high frequency circuit substrate, a wiring pattern may, alternatively, be lifted from the substrate surface in air to form the inductor unit 120.

This high frequency circuit substrate suffers a problem that the inductor unit 120 has to be formed by numerous cumbersome process steps, thus raising the cost. Moreover, in the high frequency circuit substrate, the electrical interference between the high frequency circuit section of the analog circuit and the baseband circuit section of the digital circuit poses a serious problem.

As a high frequency circuit substrate, a high frequency circuit substrate 130, employing an Si substrate, shown for example in FIG. 4, or a high frequency circuit substrate 140, employing a glass substrate, shown in FIG. 5, has been proposed.

The high frequency circuit substrate 130, shown in FIG. 4, is arranged so that, with the use of an Si substrate as the base substrate 131, an $SiO_2$ layer 132 is formed on this base substrate 131, and a passive device layer 133 is formed by for example a photolithographic technique. Although not shown, a passive device unit 135, such as an inductor unit, a resistance unit or a capacitor unit, is formed in multiple layers, along with a wiring layer 134, through an insulating layer 136, in the inside of the passive device layer 133 of the high frequency circuit substrate 130, in a manner not shown in detail.

In the high frequency circuit substrate 130, a terminal section 137, connected to the wiring layer 134, is formed through e.g., a via-hole on the passive device layer 133. On this terminal section 137, there are mounted functional devices 138, such as high frequency ICs or LSIs, by for example a flip chip mounting method. With the high frequency circuit substrate 130, the high frequency circuit section is separated from the baseband circuit section, by mounting on e.g., a motherboard, for preventing electrical interference between the two circuits.

Meanwhile, if, with the high frequency circuit substrate 130, the passive device unit 135 is to be formed within the passive device layer 133, the base substrate 131, which is an electrically conductive Si substrate, tends to interfere with optimum high frequency characteristics of the passive device unit 135.

On the other hand, in a high frequency circuit substrate 140, shown in FIG. 5, a glass substrate is used as the base substrate 141, in order to overcome the problem of the base substrate 131 in the high frequency circuit substrate 130 described above. A passive device layer 142 is formed by for example a photolithographic technique on the base substrate 141 of the high frequency circuit substrate 140. Although not shown, a passive device unit 144, such as an inductor unit, a resistance unit or a capacitor unit, is formed in multiple layers, along with a wiring layer 143, through an insulating layer 145, in the inside of the passive device layer 142 of the high frequency circuit substrate 140, in a manner not shown in detail.

In the high frequency circuit substrate 140, a terminal section 146, connected to the wiring layer 143, is formed through e.g., a via-hole on the passive device layer 142. On this terminal section 146, there are directly mounted functional devices 147, such as high frequency ICs or LSIs, by for example a flip chip mounting method. In this high frequency circuit substrate 140, an electrically non-conductive glass substrate is used as the base substrate 141 to suppress the capacitive coupling between the base substrate 141 and the passive device layer 142 to form the passive device unit 144 of optimum high frequency characteristics within the passive device layer 142. In this high frequency circuit substrate 140, a terminal pattern is formed on the surface of the passive device layer 142, for mounting on e.g., a motherboard, and connection to the motherboard is made by for example a wire bonding method.

In these high frequency circuit substrates 130, 140, high-precision passive device layers 133, 142 are formed on the base substrates 131, 141, as described above. In forming the passive device layer as a thin film, the base substrates 131, 141 need to exhibit thermal resistance against rise in the surface temperature during sputtering and contact alignment properties during masking, and to hold depth of focus during the lithographic processing.

Thus, the base substrates 131, 141 are required to be flat with high precision and to exhibit insulating properties, thermal resistance or resistance against chemicals. The base substrates 131, 141, formed as Si or glass substrate, exhibits these properties, thus enabling formation of an inexpensive low loss passive device by a separate process from the LSI forming process.

In the high frequency circuit substrates 130, 140, passive devices may be formed to a higher precision on the base substrates 131, 141 than is possible with the pattern forming methods by printing as used in the conventional ceramic module technique or with the wet etching methods used for forming a wiring pattern on the printing wiring board. Additionally, the device size can be reduced to approximately one hundredth of the area of the base substrate. Moreover, with the high frequency circuit substrates 130, 140, in which an Si substrate or a glass substrate is used as the base substrates 131, 141, the use limit frequency of the passive device may be increased to 20 GHz or higher.

In these high frequency circuit substrates 130, 140, patterns for high frequency signals, interconnections for supplying the power or providing ground connection or interconnection for control signals maybe achieved through the wiring layers 134, 143 formed on the base substrates 131, 141 described above. Thus, in the high frequency circuit substrates 130, 140, such problems may be produced as electrical interference across respective wirings, increased cost due to multi-layered wirings or bulkiness in size due to layout of the interconnections.

In the high frequency circuit substrates 130, 140, the cost is raised further due to use of a relatively expensive Si or glass substrate for the base substrates 131, 141.

In the high frequency circuit substrates 130, 140, the surfaces of the insulating layers 136, 145 become irregular due to thicknesses of the subjacent wiring layers 134, 143 to render it difficult to form the wiring layers 134, 143 or via-holes to a high accuracy on the surfaces of these irregular surfaces of the insulating layers 136, 145. In the high frequency circuit substrates 130, 140, since the surfaces of the insulating layers 136, 145 are irregular patterning images of the wiring layers 134, 143, the patterning images of the wiring layers 134, 143 or the via-holes become de-focused when the wiring layers 134, 143 or the vias are formed in the insulating layers 136, 145 using a photosensitive material, to render it difficult to form the wiring layers 134, 143 or the via-holes with high precision.

The high frequency circuit substrates 130, 140 are formed by mounting high frequency module unit 150 on a motherboard 151, as described above, as shown in FIG. 6. Here, the high frequency circuit substrate 130 is taken as an example.

In the high frequency module unit 150, the high frequency circuit substrate 130 is mounted on a major surface of the motherboard 151, as shown in FIG. 6. Moreover, the high frequency module unit 150 is sealed in its entirety by a shield cover 152 of, for example, an insulating resin. In the high frequency module unit 150, the pattern interconnections and input/output terminal units are formed on the front and back sides of the motherboard 151, while a large number of lands 153 are formed around the loading area for the high frequency circuit substrate 130.

In the high frequency module unit 150, the high frequency circuit substrate 130 is mounted on the motherboard 151 and, in this state, the wiring layer 136 of this high frequency circuit substrate 130 and the lands 153 are interconnected with wires 154 of the wire bonding method to supply the power or signals to the high frequency circuit substrate 130. Meanwhile, the high frequency circuit substrate 140 is mounted in similar manner to the motherboard 151.

In this high frequency module unit 150, including the shield cover 152 for sealing the functional devices 138, such as high frequency ICs or LSIs, loaded on the high frequency circuit substrate 130, it is a frequent occurrence that heat evolved from the functional devices 138 is confined in the shield cover 152 to deteriorate the operating characteristics.

In the high frequency module unit 150, in which the base substrate 131 of the high frequency circuit substrate 130 is an Si substrate, it is difficult to provide a heat dissipating structure to the base substrate 131. Moreover, since the passive device layer 133 is provided through the base substrate 131 on the motherboard 151, the device becomes bulky in size along its thickness.

Moreover, in the high frequency module unit 150, it is difficult to provide a wiring structure in the base substrate 131 of the high frequency circuit substrate 130 and hence a large number of the lands 153 are provided therearound for supplying the power, with the consequence that the device is increased in size in the planar direction.

DISCLOSURE OF THE INVENTION

It is therefore an object of the present invention to provide a high frequency circuit block unit, a producing method therefor, a high frequency module device and a producing method therefor, by means of which the problems inherent in the conventional high frequency module device may be overcome.

It is another object of the present invention to provide a high frequency circuit block unit, a producing method therefor, a high frequency module device and a producing method therefor, by means of which passive devices or the wiring unit can be formed with high precision and the unit or device may be reduced in size and cost.

The present invention provides a high frequency circuit block unit comprising a plurality of unit wiring layers, in each of which a wiring layer having a passive device and a connection land unit in a portion thereof is formed embedded in a major surface of an insulating layer. The plural unit wiring layers are layered on a release layer formed on a major surface of a dummy substrate. The wiring layers of the plural unit wiring layers are electrically interconnected, while the major surfaces of the plural unit wiring layers are planarized in their entirety. The dummy substrate and the release layer are removed on peeling off from the release layer to form the high frequency circuit block unit.

In this high frequency circuit block unit, the major surfaces of the plural unit wiring layers are planarized in their entirety, and the dummy substrate is removed to produce the block unit. Thus, the major surfaces of the respective unit wiring layers are not susceptible to micro-irregularities, so that the passive devices and the wiring layers may be formed on the respective unit wiring layers with high precision. Since the base substrate is unneeded, the block unit may be reduced in size and cost.

The present invention also provides a method for producing a high frequency circuit block unit comprising a release layer forming step of forming a release layer on a dummy substrate, and a layering step of layering a plurality of unit wiring layers on the release layer. Each of the unit wiring layers includes a wiring layer formed embedded in the major surface of an insulating layer. The wiring layer includes a passive device and a connection land unit in a portion thereof, while the wiring layers of the unit wiring layers are electrically interconnected. The method also includes a planarizing step of planarizing the major surfaces of the plural unit wiring layers in their entirety, and a substrate removing step of peeling off the plural unit wiring layers from the release layer for removing the dummy substrate and the release layer.

In this method for producing a high frequency circuit block unit, plural unit wiring layers, each made up by an insulating layer and a wiring layer, are formed on a dummy substrate, the major surfaces of the respective unit wiring layers are planarized in their entirety and the dummy substrate is removed from the plural unit wiring layers to produce the high frequency circuit block unit. Thus, in the present method for producing a high frequency circuit block unit, the major surfaces of the respective unit wiring layers are not susceptible to micro-irregularities, so that the passive devices and the wiring layers may be formed on the respective unit wiring layers with high precision. Since the base substrate is unneeded, the block unit produced may be reduced in size and cost.

The present invention also provides a high frequency module device comprising a high frequency circuit block unit produced by layering a plurality of unit wiring layers, in each of which a wiring layer having a passive device and a connection land unit in a portion thereof is formed embedded in the major surface of an insulating layer, on a release layer formed on a major surface of a dummy substrate. The wiring layers of the plural unit wiring layers are electrically interconnected, while the major surfaces of the plural unit wiring layers being planarized in their entirety. The dummy substrate and the release layer are removed to form the high frequency circuit block unit. The high frequency module device also comprises a motherboard having a connecting portion exposed from a major surface thereof. The high frequency circuit block unit is mounted to the major surface of the motherboard as the connection land unit and the connecting portion are electrically interconnected.

In this high frequency module device, the major surfaces of the plural unit wiring layers, making up the high frequency circuit block unit, layered on the dummy substrate, are planarized in their entirety, and the dummy substrate is removed to produce the high frequency circuit block unit. Thus, in the high frequency module device, the major surfaces of the respective unit wiring layers of the high frequency circuit block unit are not susceptible to micro-irregularities, so that the passive devices and the wiring layers may be formed on the respective unit wiring layers with high precision. Since the base substrate is unneeded, the block unit produced may be reduced in size and cost.

The present invention also provides a method for producing a high frequency module device comprising a block unit forming step of forming a high frequency block unit, in which the block unit forming step includes a release layer forming step of forming a release layer on a dummy substrate, a layering step of layering a plurality of unit wiring layers on the release layer, each of the unit wiring layers including a wiring layer formed embedded in the major surface of an insulating layer, the wiring layer including a passive device and a connection land unit in a portion thereof, the wiring layers of the unit wiring layers being electrically interconnected, a planarizing step of planarizing the major surfaces of the plural unit wiring layers in their entirety, a substrate removing step of peeling off the plural unit wiring layers from the release layer for removing the dummy substrate and the release layer, and a block unit mounting step of mounting the high frequency circuit block unit on a major surface of a motherboard, having a connecting portion exposed from a major surface thereof, as the connecting land unit and the connecting portion are electrically interconnected.

In this producing method for a high frequency module device, a plural number of unit wiring layers, each made up by an insulating layer and a wiring layer, are formed on a dummy substrate, the major surfaces of the unit wiring layers are planarized, and the dummy substrate is removed from the plural unit wiring layers to form a high frequency circuit block unit, which is mounted on the motherboard to produce the high re module device. Thus, with the present producing method for a high frequency module device, the major surfaces of the respective unit wiring layers of the high frequency circuit block unit are not susceptible to micro-irregularities, so that the passive devices and the wiring layers may be formed on the respective unit wiring layers with high precision. Since the base substrate is unneeded, the block unit produced may be reduced in size and cost.

Other objects, features and advantages of the present invention will become more apparent from reading the embodiments of the present invention as shown in the drawings.

BRIEF DESCRIPTION OF THE DRAWINGS

FIG. 11 illustrates the manufacturing process for a high frequency module device and specifically depicts a longitudinal cross-sectional view showing the state in which a metal plating layer has been formed on a first insulating layer.

FIG. 12 illustrates the manufacturing process for a high frequency module device and specifically depicts a longitudinal cross-sectional view showing the state in which a first unit wiring layer has been formed.

FIG. 23 illustrates a manufacturing process for a high frequency module device and depicts a longitudinal cross-sectional view showing the state in which a resin layer has been formed on the third unit wiring layer.

FIG. 24 illustrates a manufacturing process for a high frequency module device and depicts a longitudinal cross-sectional view showing the state in which polishing processing has been applied to the functional device and to the resin layer.

BEST MODE FOR CARRYING OUT THE INVENTION

Figure 1:
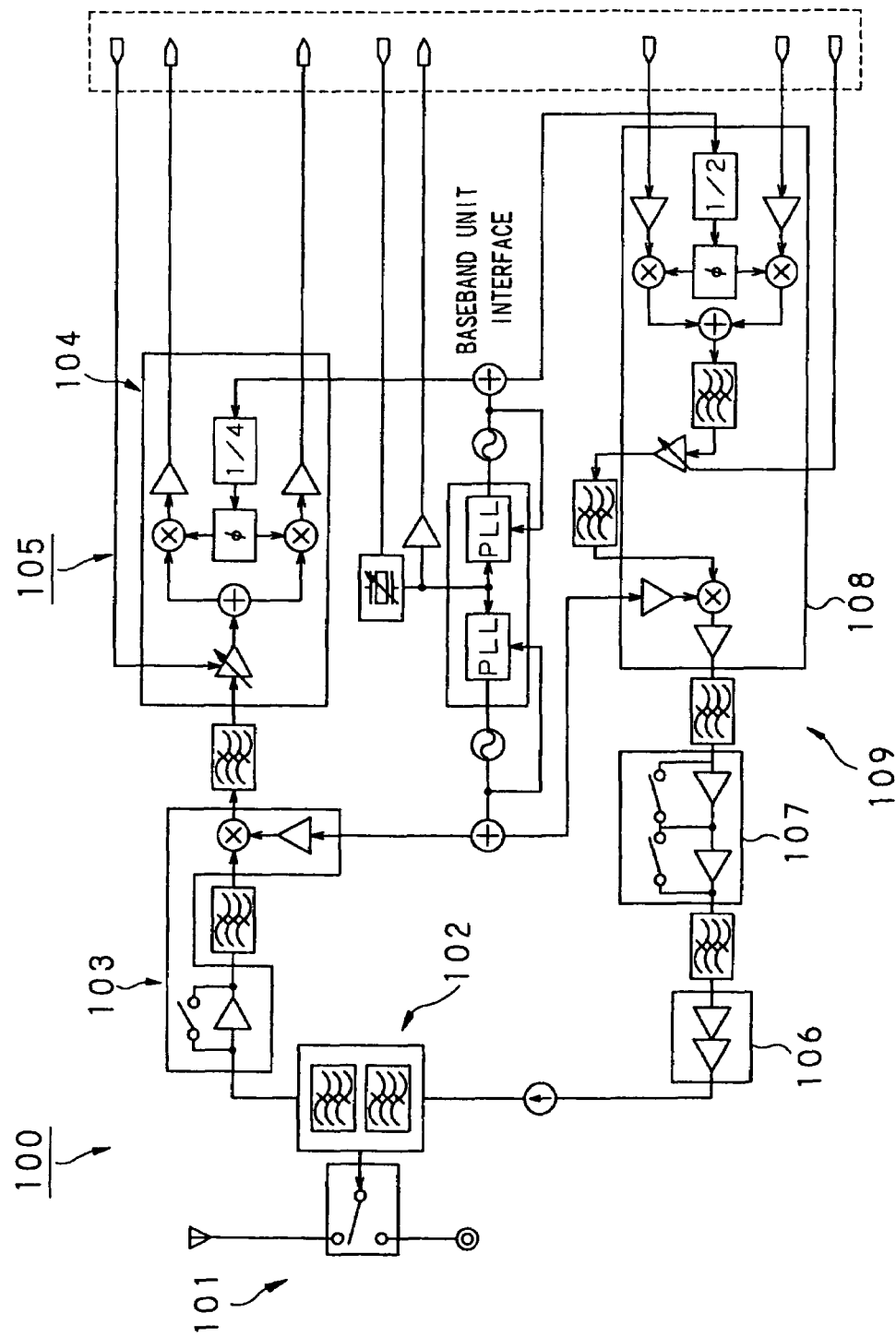
FIG. 1 is a block circuit diagram showing a high frequency transmission/reception circuit by a superheterodyne system.
Figure 2:
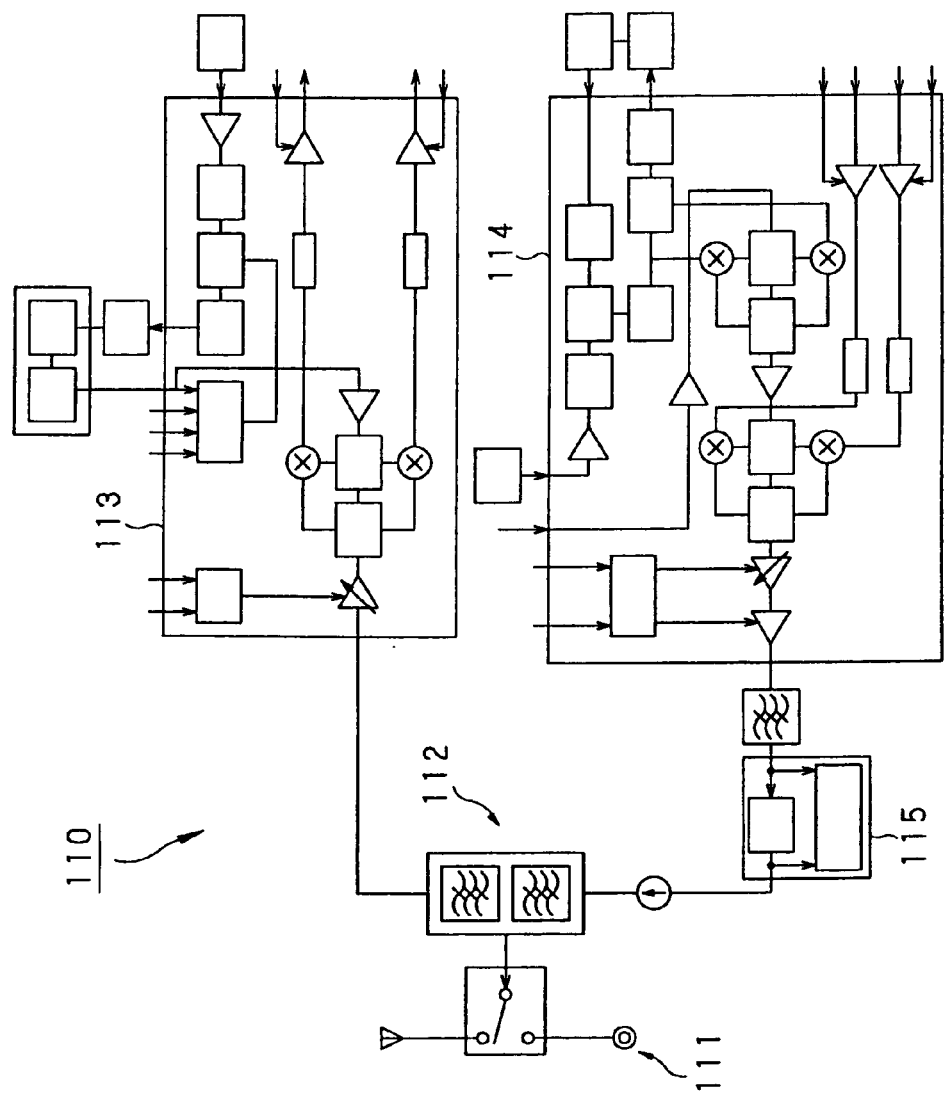
FIG. 2 is a block circuit diagram showing a high frequency transmission/reception circuit by a direct conversion system.
Figure 3A:
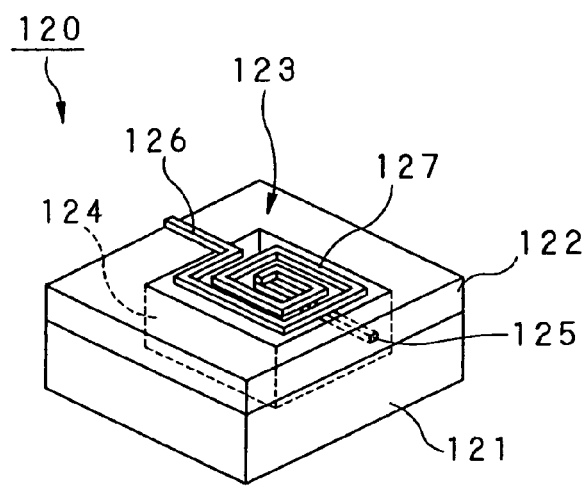
FIG. 3A is a perspective view showing essential portions of an inductor unit provided to a conventional high frequency circuit substrate.
Figure 3B:
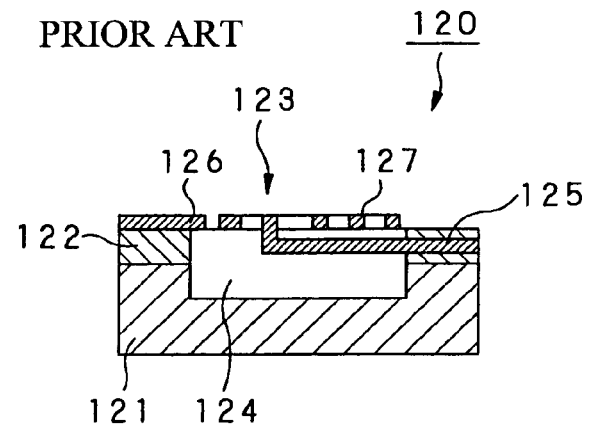
FIG. 3B is a longitudinal cross-sectional view thereof.
Figure 4:
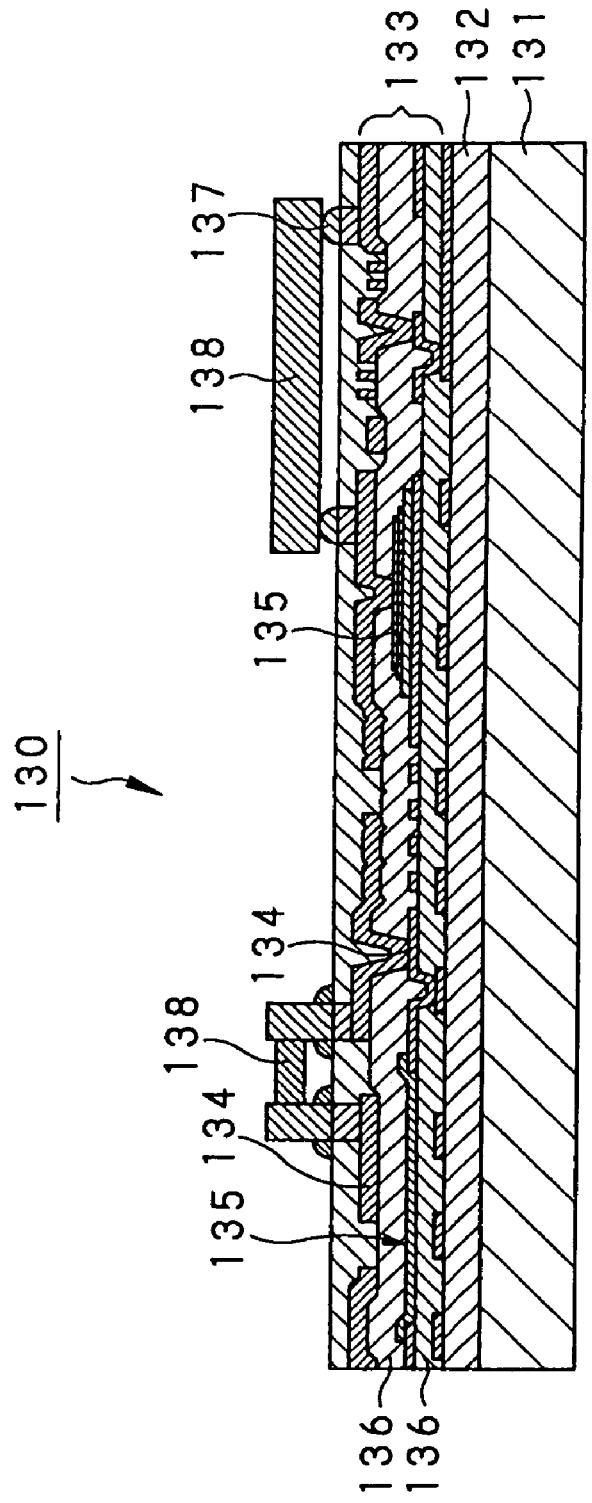
FIG. 4 is a longitudinal cross-sectional view showing a structure in which a silicon substrate is used as a base substrate of the high frequency circuit substrate.
Figure 5:
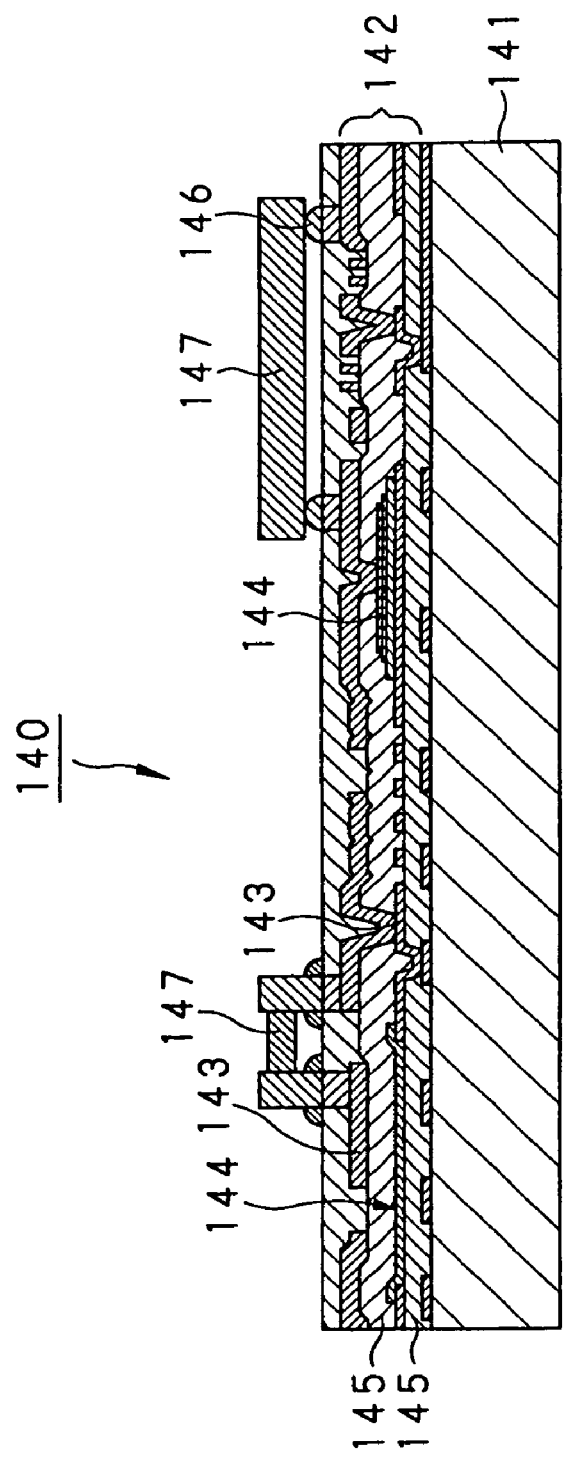
FIG. 5 is a longitudinal cross-sectional view showing a structure in which a glass substrate is used as a base substrate of the high frequency circuit substrate.
Figure 6:
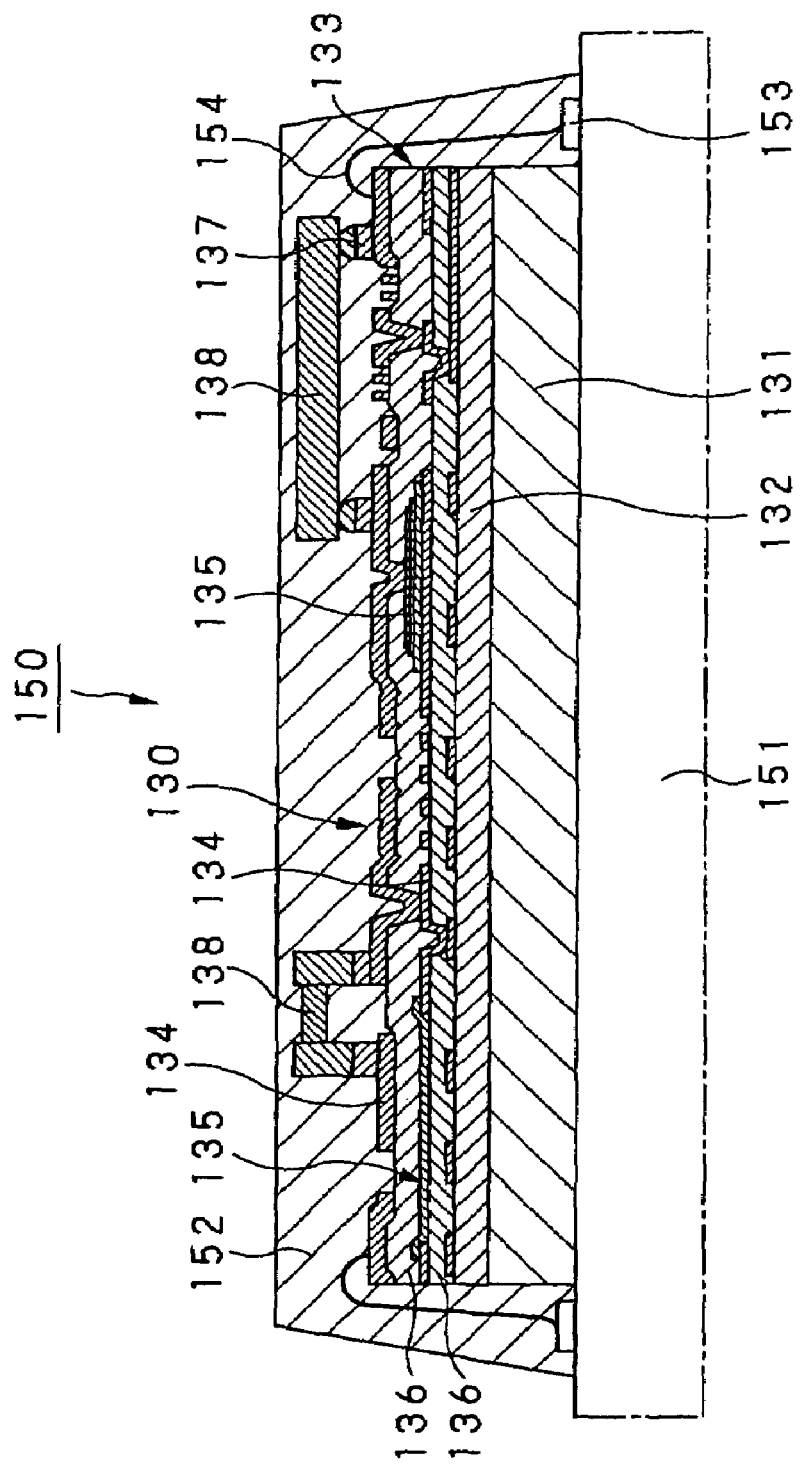
FIG. 6 is a longitudinal cross-sectional view showing a high frequency module device in which the high frequency circuit substrate has been mounted on the motherboard.

Referring to the drawings, certain preferred embodiments of the present invention will be explained in detail.

Figure 7:
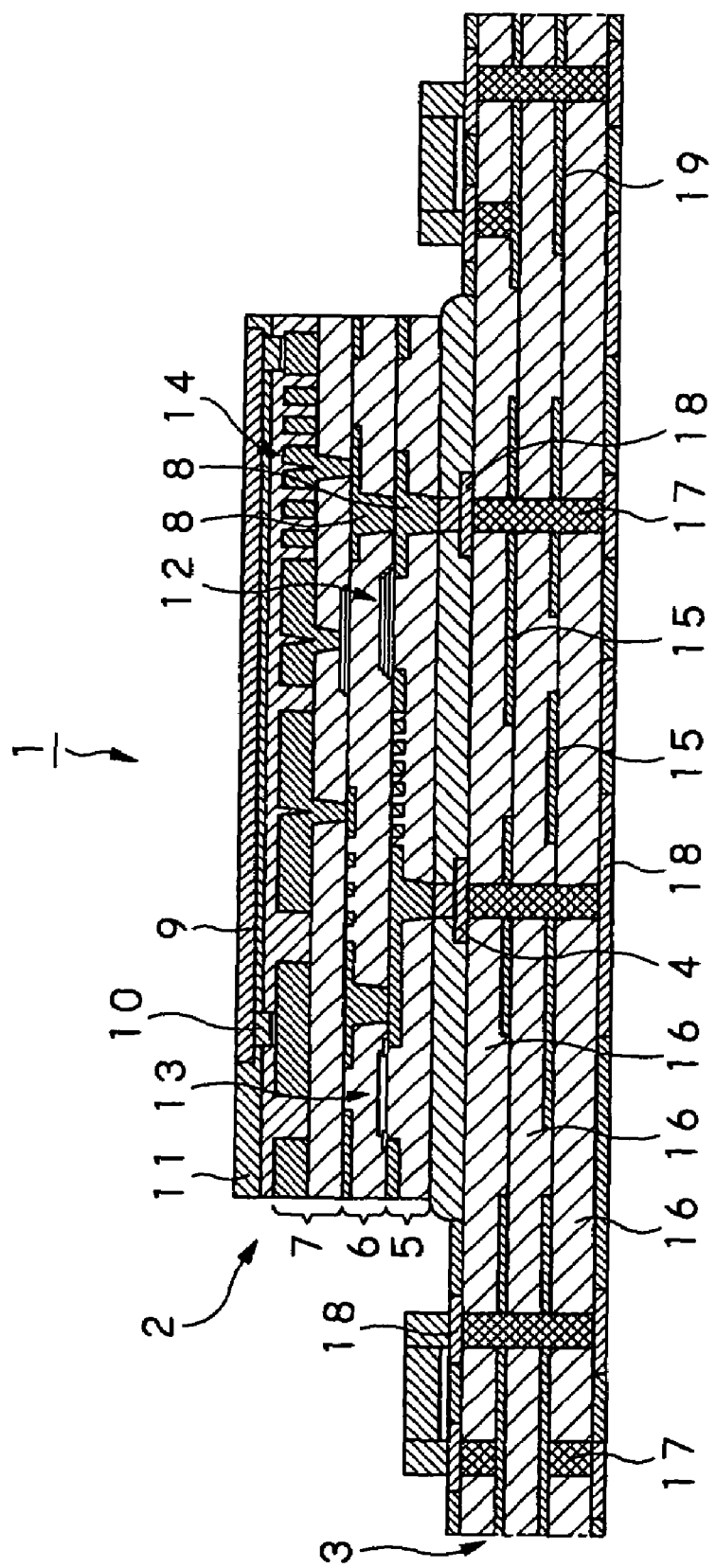
FIG. 7 is a cross-sectional view showing an instance of a high frequency module device according to the present invention.
Figure 8:
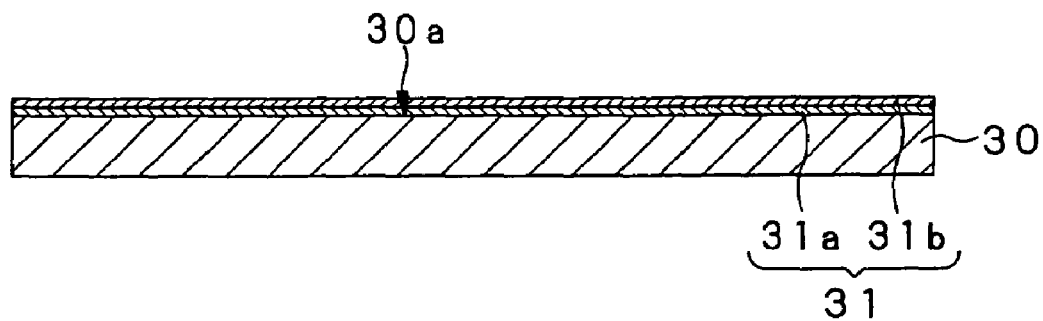
FIG. 8 illustrates a manufacturing process for a high frequency module device and specifically depicts a longitudinal cross-sectional view of a dummy substrate.

A high frequency module device 1 according to the present invention forms a high frequency circuit for performing exchange operations, etc. for high frequency signals by, for example, a superheterodyne system or a direct conversion system, in a transmission/reception unit provided in e.g., a portable communication terminal equipment, as shown in FIG. 7. The high frequency module device 1 is comprised of a high frequency circuit block unit 2, hereinafter referred to as a block unit, that is a high frequency circuit substrate, electrically connected and mounted to a motherboard 3 by for example bump units 4, such as solder.

The block unit 2 includes a second unit wiring layer 6, layered on the major surface of a first unit wiring layer 5, and a third unit wiring layer 7 on the major surface of the second unit wiring layer 6. These first to third unit wiring layers 5 to 7 are each formed by an insulating layer and pattern interconnections.

In the block unit 2, the first unit wiring layer 5 to the third unit wiring layer 7 are electrically interconnected by a via 8 extending through the totality of the layers or through the upper and lower layers. In the block unit 2, the major surfaces of the first unit wiring layer 5 to the third unit wiring layer 7 are planarized by a chemical-mechanical polishing (CMP) to enable a via-on-via structure in which, for example, a via 8 of the second unit wiring layer 6 is formed on a via 8 formed in the first unit wiring layer 5. Since the major surfaces of the first unit wiring layer 5 to the third unit wiring layer 7 in the block unit 2 are planarized, the pattern interconnections on the upper layers of the unit wiring layers may be formed with high precision.

The block unit 2 is mounted on the major surface of the third unit wiring layer 7 in such a manner that functional devices 9, such as semiconductor chips or LSI (large-scale integrated circuit) chips, are electrically connected to a pattern interconnection of the third unit wiring layer 7 with a bump 10 for a device by for example a flip chip bonding method. The block unit 2 is reduced in its entirety in thickness by forming a resin layer 11 around the functional devices 9 on the major surface of the third unit wiring layer 7 and by polishing these functional devices 9 and the resin layer 11.

In preset positions in the pattern interconnections in the first unit wiring layer 5 to the third unit wiring layer 7 of the block unit 2, there are formed passive device units, such as a capacitor unit 12, a resistor unit 13 and an inductor unit 14. The capacitor unit 12 is e.g., a decoupling capacitor or a DC-cut capacitor and is formed as a thin film by a tantalum oxide (TaO) film. The resistor unit 13 is e.g., a resistor for a terminal resistor and is formed as a thin film of tantalum nitride (TaN).

Since the major surfaces of the first unit wiring layer 5 to the third unit wiring layer 7 of the block unit 2 are planarized, as described above, the passive device units can be formed with high accuracy. With the block unit 2, in which the passive device units are formed as thin films in each unit wiring layer with high accuracy, without employing e.g., semiconductor chips, passive device units of small size and high performance can be loaded.

The block unit 2 is formed by sequentially layering the first unit wiring layer 5 to the third unit wiring layer 7, on a dummy substrate 30 having a planar major surface, via a release layer 31, with the first unit wiring layer 5 to the third unit wiring layer 7 being peeled off at the release layer 21. Thus, the block unit 2 is of such a structure which does not use a base substrate, such as a glass substrate or an Si substrate. Meanwhile, the dummy substrate 30 may be re-used as necessary.

The motherboard 3 is composed of plural wiring layers 15, with the interposition of insulating layers 16 between the respective neighboring layers, with these wiring layers 15 being interconnected layer by layer by a via-hole 17 extending through the totality of the wiring layers or through the upper and lower wiring layers. A plural number of input/output terminal units 18 are provided on the front and rear major surfaces of the motherboard 3 and operate as connection terminals for the external power supply or as a base for the bumps 4 in mounting the block unit 2. In the motherboard 3, the plural wiring layers 15 operate as wirings for transmitting e.g., the power, supplied from the input/output terminal units 18, control signals or high frequency signals to the block unit 2, while also operating as a grounding unit (grounding electrode) 19.

As a material for the insulating layer 16, in the motherboard 3, such a material low in the dielectric constant and in Tan δ, that is superior in high frequency characteristics, for example, polyphenylene ether (PPE) bismaleidotriazine (BT-resin), polytetrafluoroethylene, polyimide, liquid crystal polymer (LCP), polynorbornene (PNB), phenolic resin or polyolefin resin, as organic materials, ceramics, as inorganic materials, or glass-epoxy, as a mixture of organic and inorganic materials, is used. It is noted that the motherboard 3 is manufactured through a routine multi-layered wiring substrate manufacturing process.

The method for manufacturing the above-described high frequency module device 1 is now explained. For producing the high frequency module device 1, a block unit 2 is first prepared. For forming the block unit 2, the dummy substrate 30 having the release layer 31 on its major surface 30a is prepared. As the dummy substrate 30, such a substrate exhibiting high thermal resistance and having highly planarized major surface, such as a glass substrate, a quartz substrate or an Si substrate, is used. The release layer 31 is formed by a metal film 31a of metal, such as copper or aluminum, formed to an even thickness on the order of 1000 Å over the entire surface of the major surface 30a of the dummy substrate 30 by e.g., a sputtering method or a chemical vapor deposition method (CVD), and a resin film 31b of, for example, polyimide resin, formed to a thickness on the order of 1 to 2 μm on the entire surface of the metal film 31a by e.g., a spin coating method.

Figure 9:
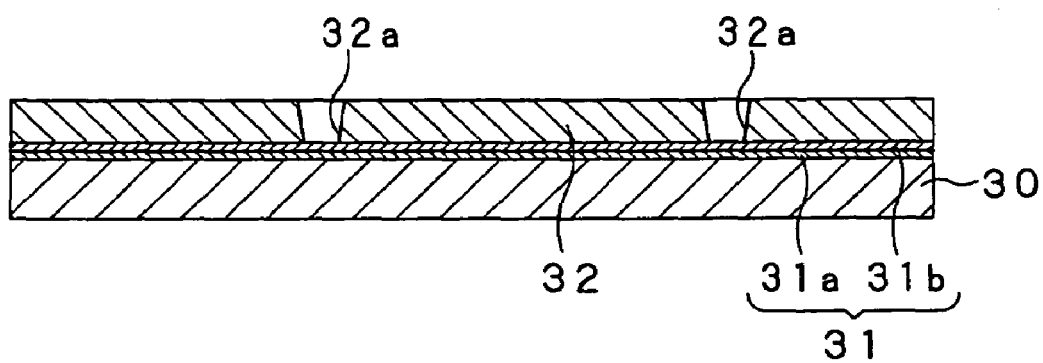
FIG. 9 illustrates a manufacturing process for a high frequency module device and specifically depicts a longitudinal cross-sectional view showing the state in which a first insulating layer has been formed on the dummy substrate.

Then, a first insulating layer 32 is formed to an even thickness on the release layer 31, as shown in FIG. 9. The first insulating layer 32 is formed as a film from an insulating dielectric material, generally known in the conventional wiring substrate manufacturing process. For the first insulating layer 32, an insulating dielectric material low in dielectric constant and in Tanδ, that is superior in high frequency characteristics, such as polyphenylene ether (PPE) bismaleidotriazine (BT-resin), liquid crystal polymer (LCP), polynorbornene (PNB), polyimide, benzocyclobutene (BCB), epoxy resin or acrylic resin, is used. The first insulating layer 32 is formed as a film, by coating the insulating dielectric material, on the release layer 31, by for example the spin coating method, curtain coating method, roll coating method or dip coating method.

Then, in the first insulating layer 32, an opening 32a, which is to become the via 8, is formed by patterning at a predetermined position. The opening 32a is formed by patterning the first insulating layer 32. If the photosensitive insulating dielectric material is used as the first insulating layer 32, the opening 32a is formed by patterning by the photolithographic technique. If a non-photosensitive insulating dielectric material is used as the first insulating layer 32, the opening 32a is patterned by dry etching or laser processing, using a mask of aluminum or a photoresist.

Figure 10:
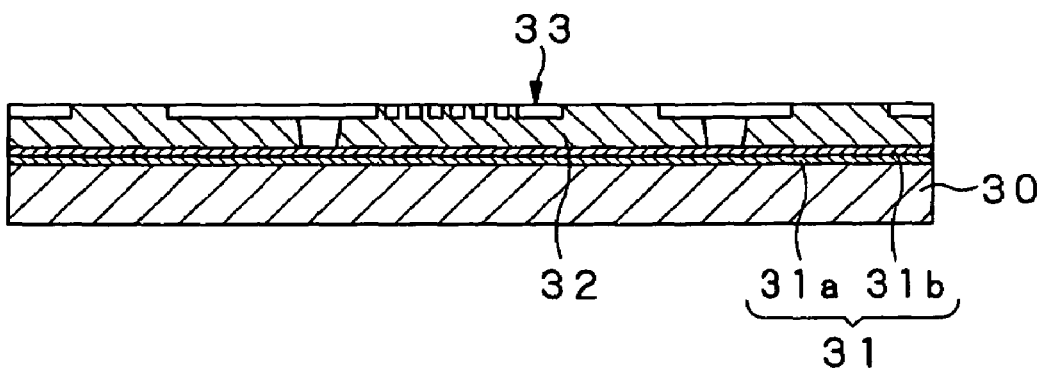
FIG. 10 illustrates a manufacturing process for a high frequency module device and specifically depicts a longitudinal cross-sectional view showing the state in which a first wiring groove has been formed in the first insulating layer.
Figure 1:
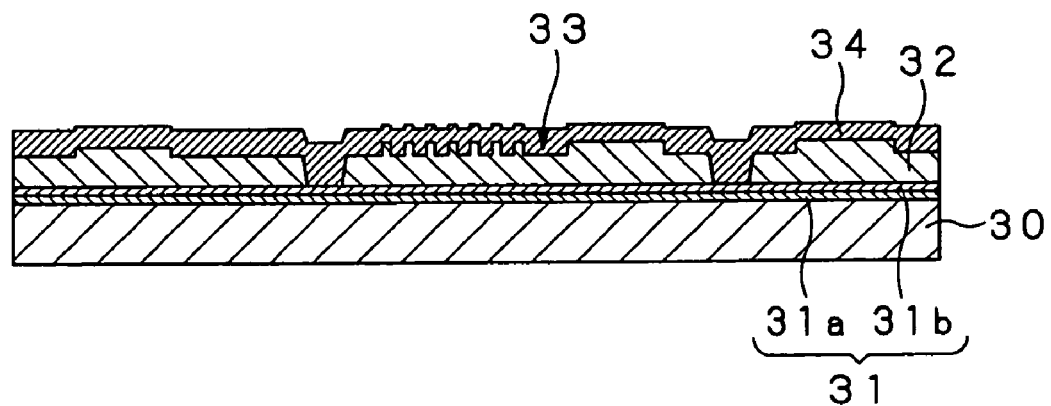
Figure 1:
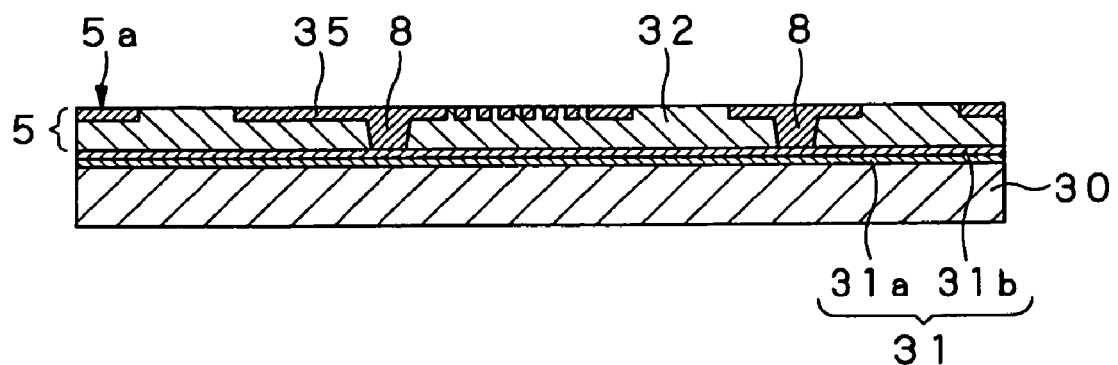

The first insulating layer 32 is then etched to form first wiring grooves 33, as shown in FIG. 10. The first wiring grooves 33 are formed by forming an etching mask, having openings corresponding to the pattern of the first wiring grooves 33, on the first insulating layer 32, applying dry etching to an area of the first insulating layer 32 not covered by the etching mask, by a reactive ion etching (RIE) by for example an oxygen plasma, and by removing the etching mask.

A metal plating layer 34 then is formed by metal plating processing on the first insulating layer 32, already provided with the first wiring grooves 33, as shown in FIG. 11. The metal plating layer 34 is formed of a highly electrically conductive metal, such as copper. For metal plating processing, any of electrolytic plating or electroless plating may be used. The metal plating is so performed that the metal plating layer 34 is applied to the entire major surface of the first insulating layer 32 provided with the first wiring grooves 33 and into the openings 32a so that the thickest portion of the metal plating layer 34 is thicker than the thickest portion of the first insulating layer 32. During the metal plating processing, in which the metal plating layer 34 is formed by the electrolytic plating, a metal film 31a of the release layer 31 operates as the voltage applying electrode.

The metal plating layer 34 is then processed with planarizing, until the first insulating layer 32 is exposed, to form a first pattern wiring 35 on the main surface of the first insulating layer 32, as shown in FIG. 12. This forms a first unit wiring layer 5, made up by the first insulating layer 32 and the first pattern wiring 35, and having a major surface highly planarized by the planarizing processing, referred to below as one major surface 5a, on the release layer 31. Since the planarizing processing simultaneously polishes the first insulating layer 32 and the metal plating layer 34, formed of different materials, the chemical-mechanical polishing (CMP) method is used. This CMP method allows polishing with material selectivity, such as to increase the polishing rate of the metal plating layer 34 of metal, such as copper, and allows the surface being polished to be planarized with high accuracy.

If, in this first unit wiring layer 5, a photosensitive insulating dielectric material is used for the first insulating layer 32, the first insulating layer 32 is formed on the highly planarized major surface 30a of the dummy substrate 30 and hence suffers from no variations in thickness, defocusing of the patterning image by the photolithographic processing may be suppressed to enable the formation of the first pattern wiring 35 or the via 8 with high accuracy.

In the first unit wiring layer 5, thus formed, the first pattern wiring 35 is embedded in the first insulating layer 32, while the one surface 5a is highly planarized by the planarizing processing by the CMP method. The vias 8 are also formed simultaneously. Since the ends of the vias 8 exposed to the one major surface 5a of the first unit wiring layer 5 are similarly highly planarized, the electrical connection of the first unit wiring layer 5 to the second unit wiring layer 6, formed above the first unit wiring layer 5 by a process as later explained, may be of a via-on-via structure in which the electrical connection is by the vias 8. This via-on-via structure enables electrical connection across the respective unit wiring layers by the shortest path, while allowing surface area reduction of the block unit 2.

Figure 13:
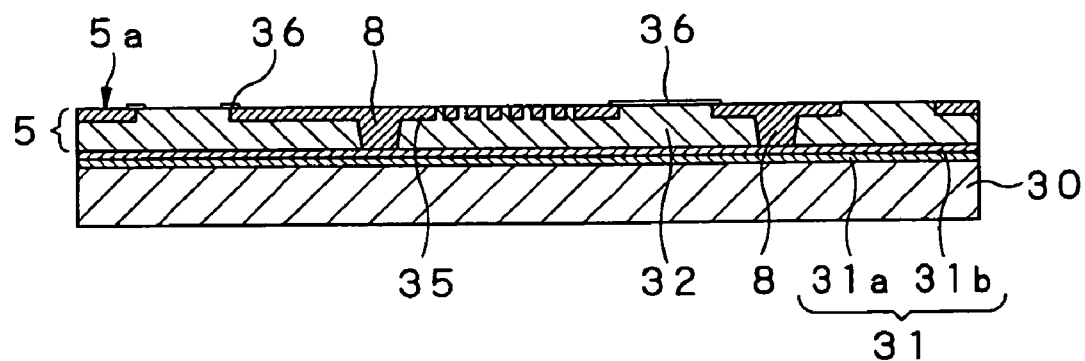
FIG. 13 illustrates the manufacturing process for a high frequency module device and specifically depicts a longitudinal cross-sectional view showing the state in which a receiving electrode unit has been formed on a first unit wiring layer.

On the one major surface 5a of the first unit wiring layer 5 are then formed, as passive devices, a lower electrode of the capacitor unit 12 and a receiving electrode unit 36 as a receiving electrode of the resistor unit 13, as shown in FIG. 13. In forming the receiving electrode unit 36, a first metal film of a metal, such as titanium, is formed on the entire surface of the one major surface 5a of the first unit wiring layer 5 having the vias 8, by for example a sputtering method or a vapor deposition method, to a thickness on the order of 200 Å. A second metal film of, for example, Cu, Al, Au or Pt, is formed to a thickness on the order of 2000 Å on the entire metal film surface.

A mask then is formed on a region of the major surface of the second metal film, in which to form the receiving electrode unit 36, and etching is applied to a non-masked area. This etching is by wet etching with the use of an acid mixture, obtained on mixing e.g., nitric acid, sulfuric acid or acetic acid, in a preset ratio, as an etchant. Since the etchant composed of the acid mixture attacks metal titanium only to a lesser extent, only the non-masked second metal film is attacked, if the etching is continued until the first metal film is exposed.

Then, etching is applied to the non-masked first metal film. This etching is by wet etching, using an acid mixture, obtained on mixing e.g., ammonium hydrofluorate and ammonium monohydrogen difluoride, in a predetermined ratio, as an etchant, or by plasma etching by e.g., $CF_4$ plasma. With this etching, only the first metal film can be etched, because the etchant or the $CF_4$ plasma attacks metals other than metal titanium only to a lesser extent. This forms the receiving electrode unit 36, made up by the first and second metal films, on the first unit wiring layer 5.

Figure 14:
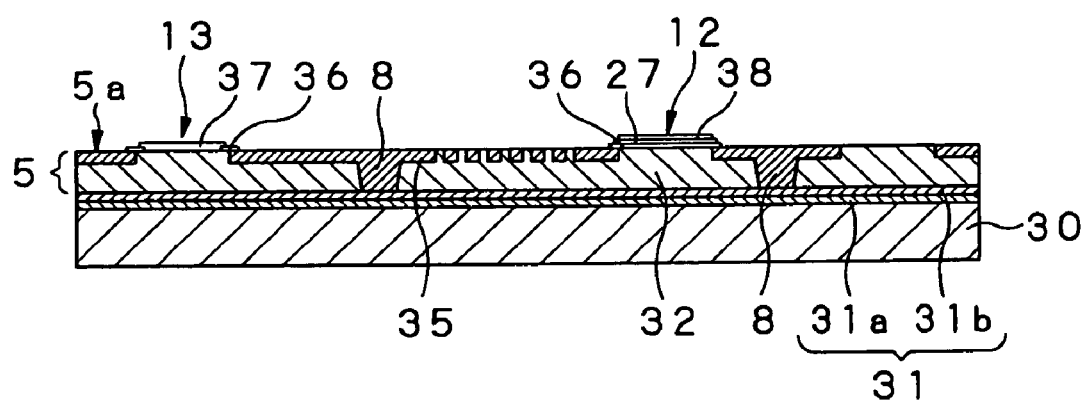
FIG. 14 illustrates the manufacturing process for a high frequency module device and specifically depicts a longitudinal cross-sectional view showing the state in which a passive device unit has been formed on a first unit wiring layer.

The capacitor unit 12 and the resistor unit 13 are then formed, as passive device units, so as to be connected to the receiving electrode unit 36, as shown in FIG. 14. When forming these passive device units, a tantalum nitride (TaN) film is formed on the entirety of the one major surface 5a of the first unit wiring layer 5 for overlying the receiving electrode unit 36. This TaN film is a base film for the dielectric film of tantalum oxide (TaO) which is to become the capacitor 12 on anodic oxidation. In forming this TaN film, a sputtering method, capable of forming a film to a thickness of the order of e.g., 2000 Å, may preferably be used.

A mask for anodic oxidation only of the portion of the TaN layer where the capacitor unit 12 and the resistor unit 13 are formed is then formed on the TaN layer. This anodically oxidizes the portion of the TaN layer which is exposed to outside of the mask opening. The portion of the TaN layer exposed to outside from the mask opening is then processed with anodic oxidation. In this processing of anodic oxidation, a voltage of 50 to 200V is applied in an electrolytic solution of, for example, ammonium borate, so that TaN will operate as an anode, thereby oxidizing the TaN layer to form the TaO layer. Meanwhile, the TaO layer may be formed to a desired thickness by adjusting the voltage applied to the TaN layer.

The mask formed on the anodically oxidized TaN layer is then removed. By so doing, the TaO layer, obtained on selective oxidation of the surface of the TaN layer, may become the dielectric material of the capacitor unit 12. The TaO layer then is dry-etched, as the site of the TaO layer, on which the capacitor unit 12 and the resistor unit 13 are to be formed, is masked with a resist. By removing the mask, the capacitor unit 12 and a dielectric film 37 of the resistor unit 13 are formed simultaneously. By so doing, passive device units, such as the capacitor unit 12 and the resistor unit 13, are formed on the first unit wiring layer 5. Since these passive device units are formed on the one major surface 5a of the highly planarized first unit wiring layer 5, the passive device units can be formed with high precision to improve high frequency characteristics. Meanwhile, the capacitor unit 12 may be formed using e.g., a BST (Ba, Sr, Ti, O) film or an STO (Sr, Ti, O) film as the dielectric film 37.

An upper electrode unit 38 is then formed on the capacitor unit 12. This upper electrode unit 38 is a film of metals, such as Al, Cu, Pt or Au, formed via an underlying layer, designed for improving the bonding, such as a film of Cr, Ni or Ti. When Al or Cu is used as the upper electrode unit 38, the upper electrode unit 38 is formed on the first unit wiring layer 5 so as to overlie the passive device units, such as by sputtering, to a thickness of the order of 2000 Å. The upper electrode unit is then formed to a preset pattern such as by masking and etching.

Figure 15:
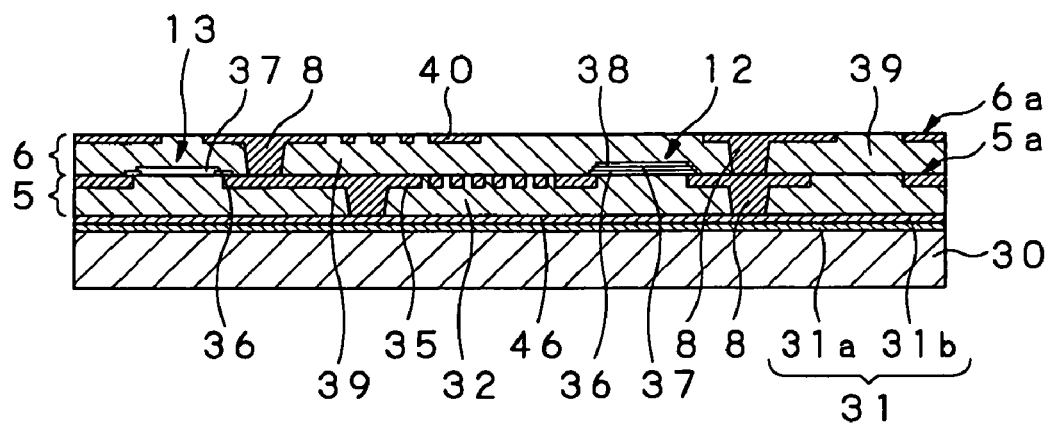
FIG. 15 illustrates a manufacturing process for a high frequency module device and specifically depicts a longitudinal cross-sectional view showing the state in which a second unit wiring layer has been formed on the first unit wiring layer.

On the first unit wiring layer 5, the second unit wiring layer 6 is then formed to overlie the passive device units, formed on the one major surface 5a, as shown in FIG. 15. This second unit wiring layer 6 is formed using the material and the process similar to those for the first unit wiring layer. The second unit wiring layer 6 is formed by a second insulating layer 39 and a second pattern wiring 40. If the photosensitive dielectric material is used for the second insulating layer 39 in the second unit wiring layer 6, the second insulating layer 39 is formed on the highly planarized first unit wiring layer 5 and is not subjected to thickness variations. Thus, it becomes possible to prevent defocusing of the patterning image by the photolithographic processing to form the second pattern wiring 40 and the via 8 wiht high accuracy.

Since the second unit wiring layer 6 is formed on the one major surface 5a of the highly planarized first unit wiring layer 5, the second pattern wiring 40 may be formed with high accuracy. A major surface 6a of the second unit wiring layer 6 facing the pattern wiring 40, hereinafter referred to as the one major surface 6a, has already been put to planarizing processing by the aforementioned CMP method and is planarized with high precision similarly to the one major surface 5a of the first unit wiring layer 5. In the block unit 2, the unit wiring layers are of a three-layered structure. This is not limitative and three or more unit wiring layers may also be provided by repeating the process of forming the first unit wiring layer 5.

Figure 16:
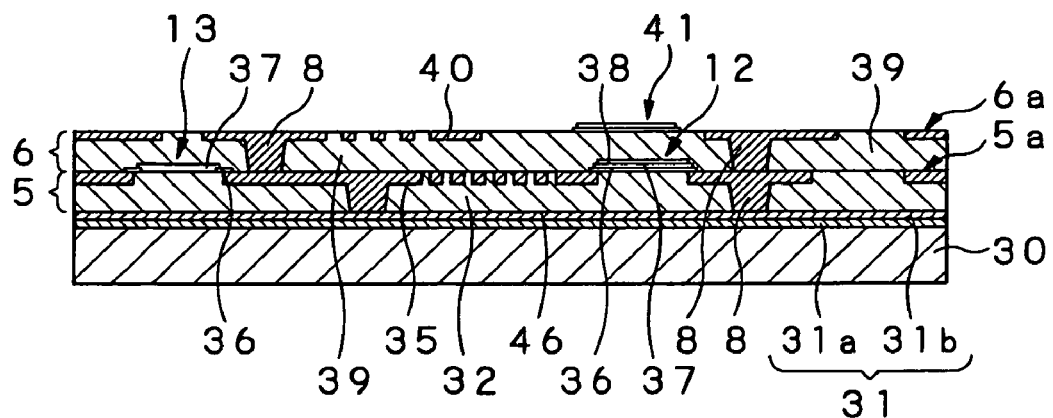
FIG. 16 illustrates a manufacturing process for a high frequency module device and depicts a longitudinal cross-sectional view showing the state in which a passive device unit has been formed on a second unit wiring layer.
Figure 17:
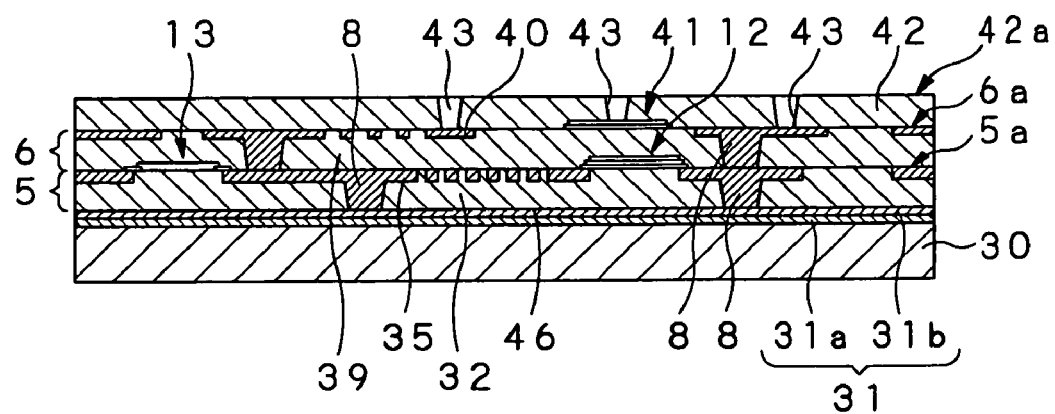
FIG. 17 illustrates a manufacturing process for a high frequency module device and depicts a longitudinal cross-sectional view showing the state in which a third insulating layer has been formed on the second unit wiring layer.

On the one major surface 6a of the second unit wiring layer 6, there is formed a capacitor unit 41, as a passive device unit, as shown in FIG. 16. This capacitor unit 41 is formed by a forming process similar to that of the capacitor unit 12 formed on the one major surface 5a of the first unit wiring layer 5. The capacitor unit 41 is formed on the one major surface 6a of the second unit wiring layer 6 and hence is formed with high precision to improve high frequency characteristics.

On the one major surface 6a of the second unit wiring layer 6, there is formed the film of the aforementioned insulating dielectric material, as a third insulating layer 42. This third insulating layer 42 is formed of a material similar to the material of the first unit wiring layer 5 and the second unit wiring layer 6. The third insulating layer 42 is formed to cover the capacitor unit 41 formed on the one major surface 6a of the second unit wiring layer 6. This third insulating layer 42 is formed on the highly planarized one major surface 6a of the second unit wiring layer 6, and hence has a surface 42a planarized with high precision.

A plural number of via-holes 43 are then formed in the third insulating layer 42. These via-holes 43 are formed in association with the upper electrode unit 41a and the second pattern wiring 40, formed on the capacitor unit 41, for partially exposing an upper electrode unit 46 and the pattern wiring 40. It is noted that, if the photosensitive insulating dielectric material is used as the third insulating layer 42, it is possible to suppress the defocusing of the patterning image by the photolithographic processing. Thus, the via-holes 43 may be formed with high accuracy.

Figure 18:
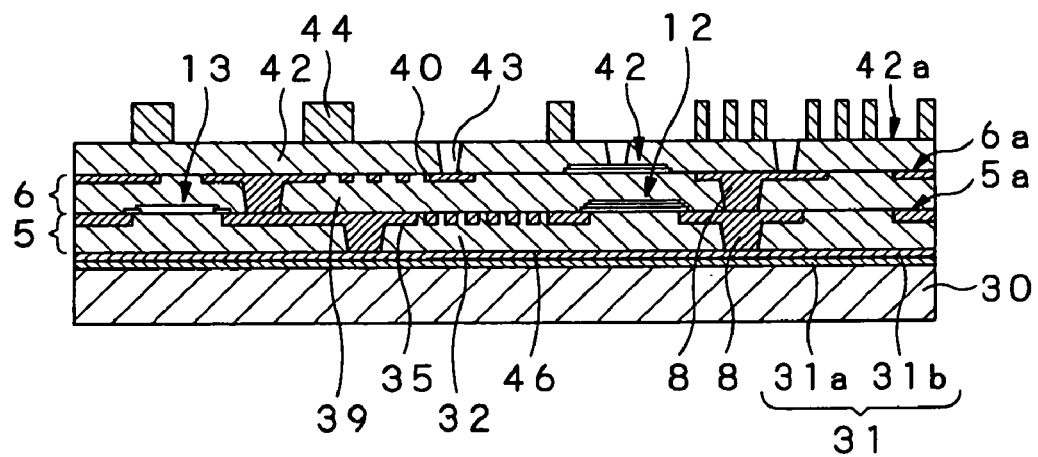
FIG. 18 illustrates a manufacturing process for a high frequency module device and depicts a longitudinal cross-sectional view showing the state in which a mask has been formed on the third insulating layer.

In the third insulating layer 42, a mask 44 then is formed by patterning, to a thickness on the order of 12 μm, for opening a predetermined location of the third insulating layer, by for example the photolithographic technique, as shown in FIG. 18. It is noted that the mask 44 may also be formed by any other suitable method, instead of by the photolithographic technique, with the use of any suitable material.

Figure 19:
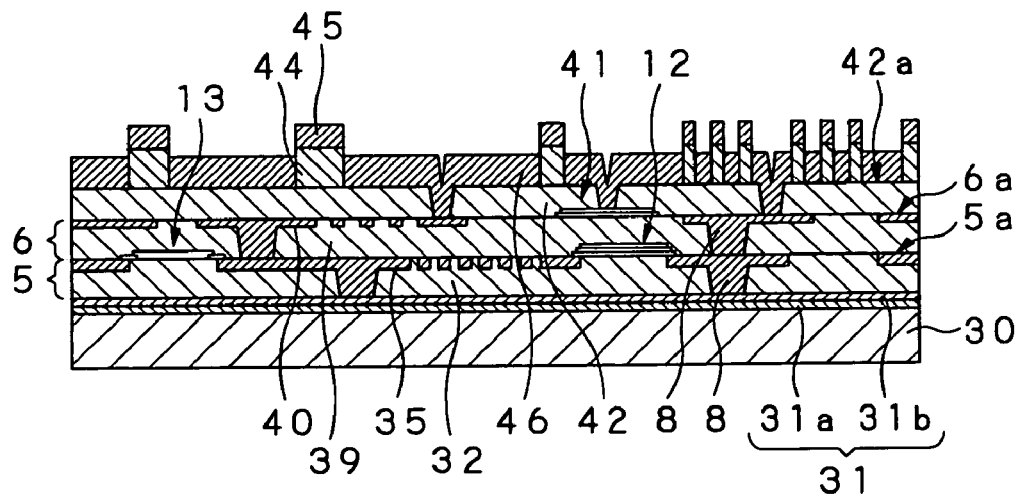
FIG. 19 illustrates a manufacturing process for a high frequency module device and depicts a longitudinal cross-sectional view showing the state in which a metal film has been formed on the third insulating layer.

On the third insulating layer 42, now provided with the mask 44, there is formed a metal film 45 to a thickness on the order of 10 μm, by for example a plating method, as shown in FIG. 19. This metal film 45 is formed by metal, such as copper.

Figure 20:
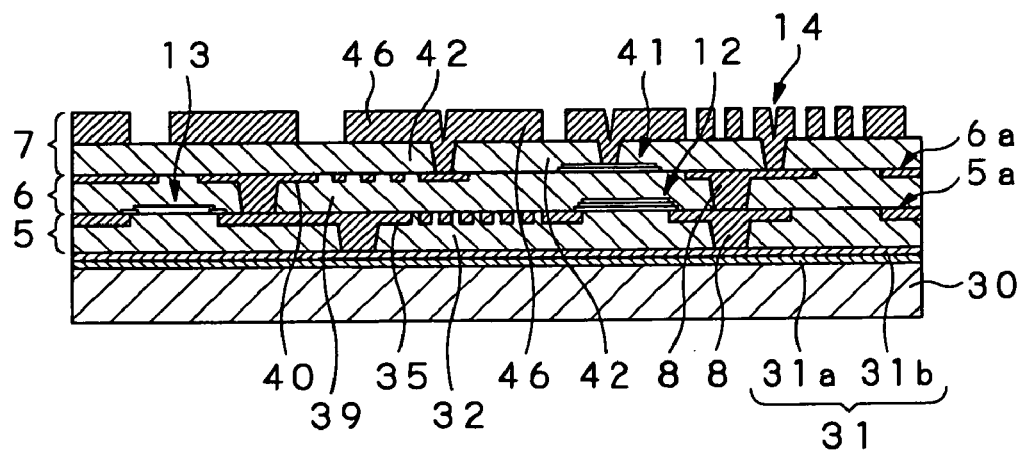
FIG. 20 illustrates a manufacturing process for a high frequency module device and depicts a longitudinal cross-sectional view showing the state in which a third unit wiring layer has been formed on a second unit wiring layer.

This mask 44 then is removed from the third insulating layer 42, as shown in FIG. 20. In this manner, a third pattern wiring 46, with a thickness on the order of 10 μm, is formed on the third insulating layer 42. In a portion of this third pattern wiring 46, there is formed an inductor 14 by patterning. In this inductor 14, a series resistance value presents a problem. Since the third pattern wiring 46 is formed to a sufficient thickness by e.g., a plating method, a sufficient function may be achieved even at a low frequency, thus allowing suppression of the loss in inductor characteristics. In this manner, the third unit wiring layer 7, made up by the third insulating layer 42 and the third pattern wiring 46, is formed on the second unit wiring layer 6.

Figure 21:
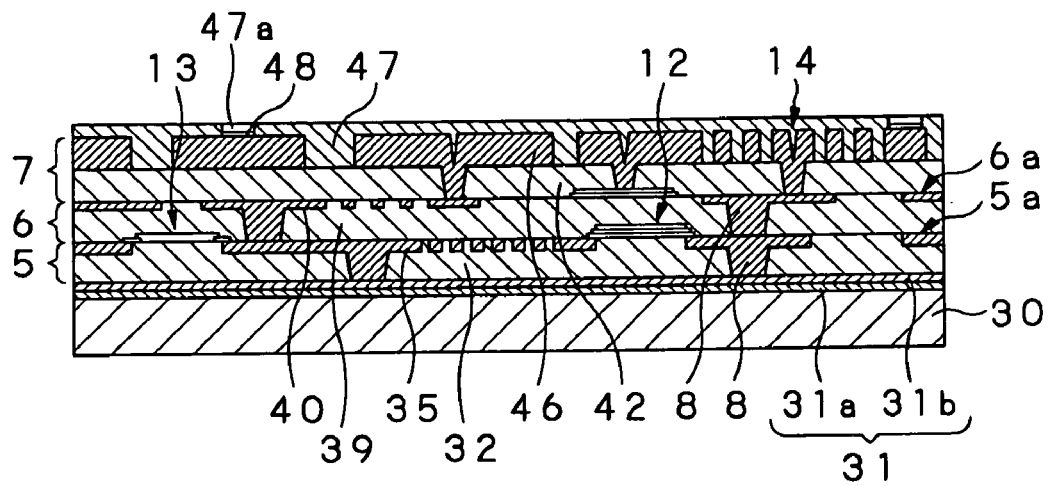
FIG. 21 illustrates a manufacturing process for a high frequency module device and depicts a longitudinal cross-sectional view showing the state in which a resist layer has been formed on the third unit wiring layer.

A resist layer 47 is then formed on the third unit wiring layer 7 for covering the entire major surface thereof, as shown in FIG. 21. For this resist layer 47, a solder resist or an insulating dielectric material, for example, is used. The resist layer 47 then is subjected to a photolithographic processing, through a mask patterned to a predetermined shape, to form an opening 47a, exposed to the third pattern wiring 46, at a predetermined position. The portion of the third pattern wiring 46, exposed from the opening 47a, is subjected to electroless plating of nickel/copper to form a basis unit 48 for the bump 10 for a device.

Figure 22:
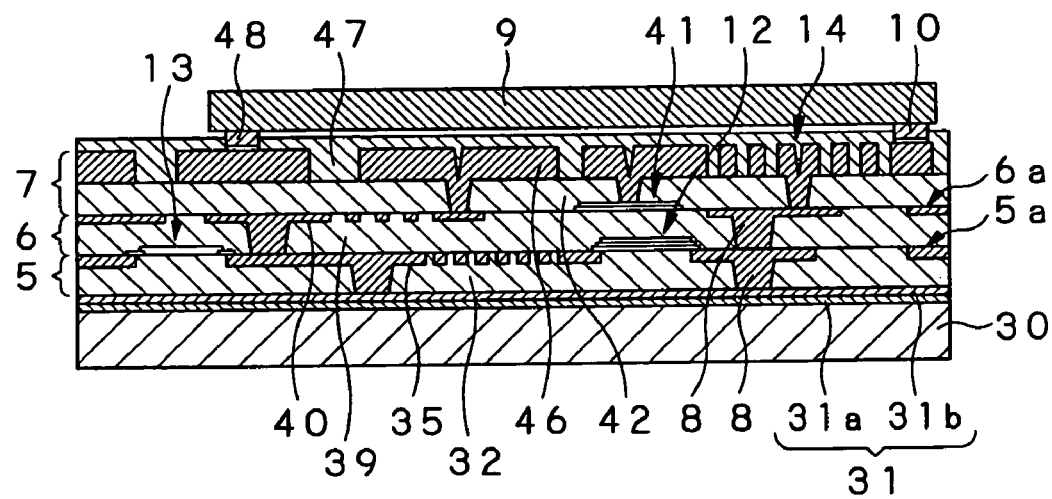
FIG. 22 illustrates a manufacturing process for a high frequency module device and depicts a longitudinal cross-sectional view showing the state in which a functional device has been formed on the third unit wiring layer.
Figure 2:
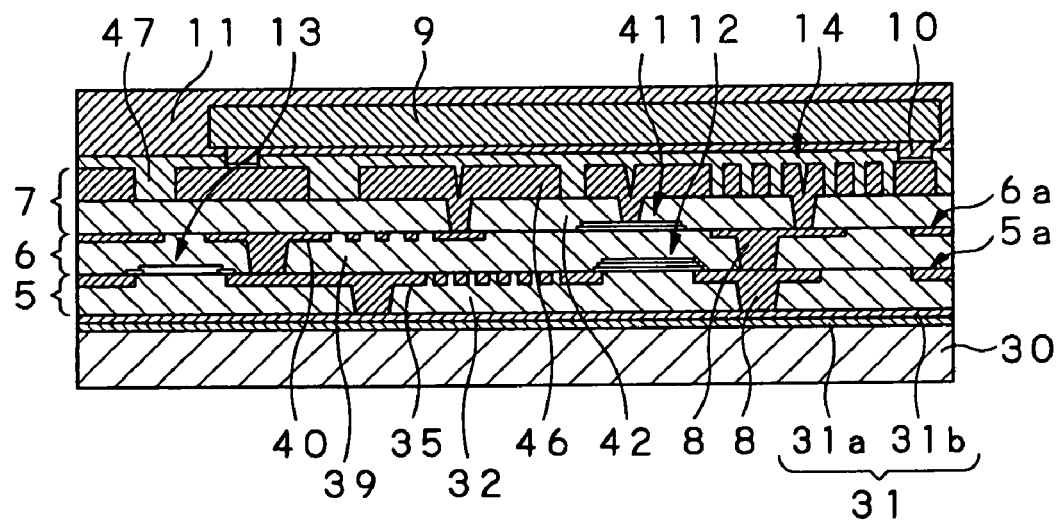
Figure 2:
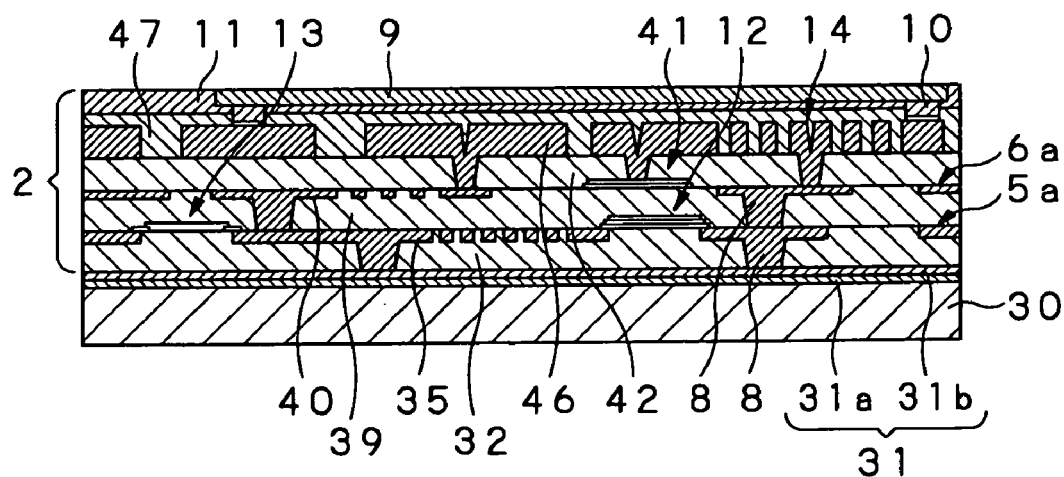

The functional device 9, such as a semiconductor chip or an LSI chip, then is mounted on top of the third unit wiring layer 7, as shown in FIG. 22. This functional device 9 is electrically connected 10 the basis unit 48, formed on the third unit wiring layer 7, via the bump 10 for a device, by the flip chip bonding method. Meanwhile, the mounting method for the functional device 9 is not limited to the flip chip bonding method, such that a face-down mounting method, for example, a tape automated bonding (TAB) method or the reed beam bonding method, may also be used.

On the third unit wiring layer 7, a resin layer 11 is then formed to overlie the mounted functional device 9, as shown in FIG. 23. The resin layer 11 is formed on the entire major surface of the third unit wiring layer 7, by, for example, a transfer molding method or by a printing method, so that the resin will be charged even into a space between the functional device 9 and the third unit wiring layer 7. For the resin layer 11, such a resin having only a low rate of shrinkage due to thermosetting, such as epoxy resin, is used. By so doing, it is possible in the first unit wiring layer 5 to third unit wiring layer 7 to prevent deformation, such as warping, due to contraction at the time of thermosetting of the resin layer 11.

The functional device 9 and the resin layer 11 are subjected to polishing, as shown in FIG. 24. This polishing processing is carried out by a mechanical polishing method employing a grinder, a chemical polishing method by wet etching, or a method employing these methods in combination (CMP method). The functional device 9 is polished, along with the resin layer 11, up to a limit thickness not obstructing the operation. This polishing proceeds in such a manner that the perimeter along the direction of the polishing surface of the functional device 9 is charged with the resin layer 11, using the dummy substrate 30 as a supporting substrate for the functional device 9 and the resin layer 11, so that no step difference will be produced between the functional device 9 and the resin layer 11. It is therefore possible to prevent edge defects of the functional devices 9 from being produced. The block unit 2, made up by the first unit wiring layer 5 to the third unit wiring layer 7 and which is provided with the functional device 9 and the resin layer 11, is formed as described above.

Figure 25:
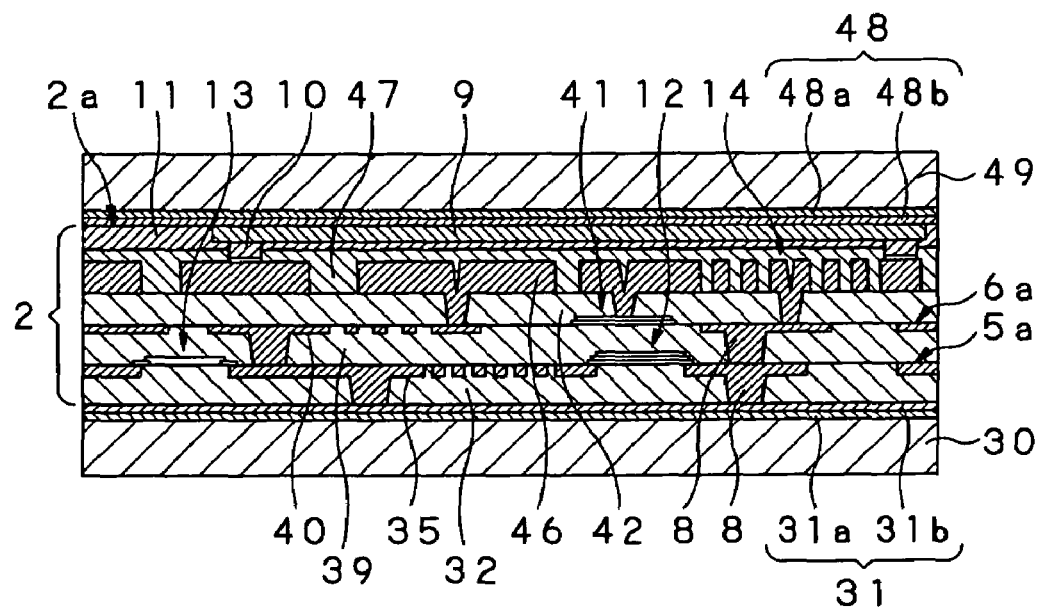
FIG. 25 illustrates a manufacturing process for a high frequency module device and depicts a longitudinal cross-sectional view showing the state in which a dummy substrate has been bonded to a major surface of a high frequency block unit.

On a polished surface, hereinafter referred to as a major surface 2a, of the functional devices 9 and the resin layer 11 of the block unit 2, a dummy substrate 49 is bonded through a release layer 48, as shown in FIG. 25. The release layer 48 is formed of the same material as the release layer 31, is of the same structure and produced by the same process as the release layer 31. The release layer 48 is made up by metal film 48a and resin film 48b. Similarly to the dummy substrate 30 described above, the dummy substrate 49 is formed by a glass substrate, a quartz substrate or an Si substrate exhibiting high thermal resistance and which has a highly planarized major surface.

Figure 26:
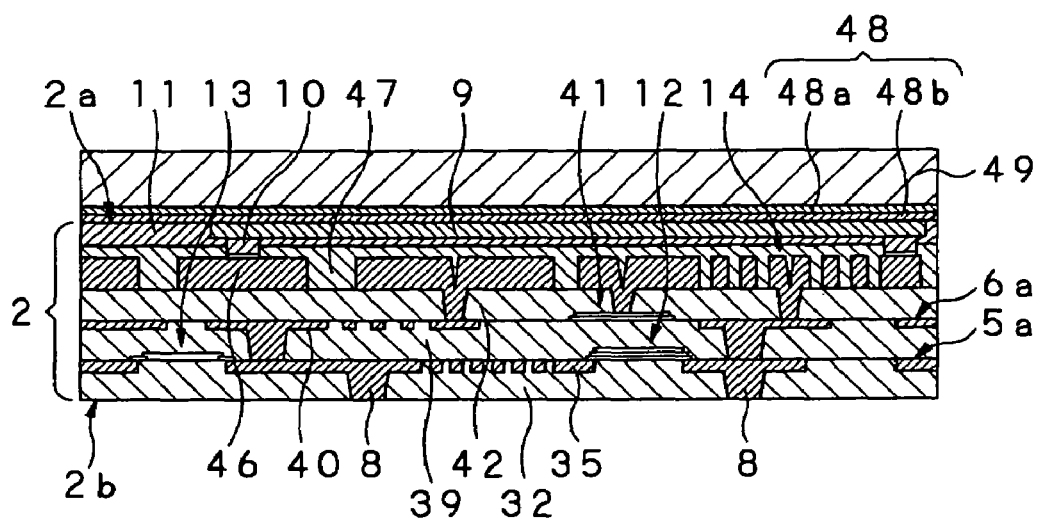
FIG. 26 illustrates a manufacturing process for a high frequency module device and depicts a longitudinal cross-sectional view showing the state in which the dummy substrate has been removed from the other major surface of the high frequency block unit.

The dummy substrate 30 then is removed from the block unit 2 along with the release layer 31, as shown in FIG. 26. Specifically, the dummy substrate 30 and the release layer 31 are dipped, along with the block unit 2, in an acidic solution of, for example, hydrochloric acid or nitric acid, so that the acidic solution is intruded into a space between the metal film 31a and the resin film 31b, as the acidic solution slightly dissolves the metal film 31a of the release layer 31. The dummy substrate 30 is removed as the peel-off proceeds between the metal film 31a and the resin film 31b, with the resin film 31b being left over on a surface 2b of the first unit wiring layer 5 of the block unit 2, hereinafter referred to as the other major surface. Consequently, a protective layer, for example, may be formed at the outset on the other major surface 2b of the block unit 2. The dummy substrate 30 may also be removed by for example laser ablation from the block unit 2.

The resin film 31b, formed on the other major surface 2b of the block unit 2, is removed by for example a dry etching method by an oxygen plasma. This exposes the via 8 on the other major surface 2b of the block unit 2. Since the major surface of the dummy substrate 30, facing the block unit 2, is highly planarized, the other major surface 2b of the block unit 2 is also highly planarized.

Figure 27:
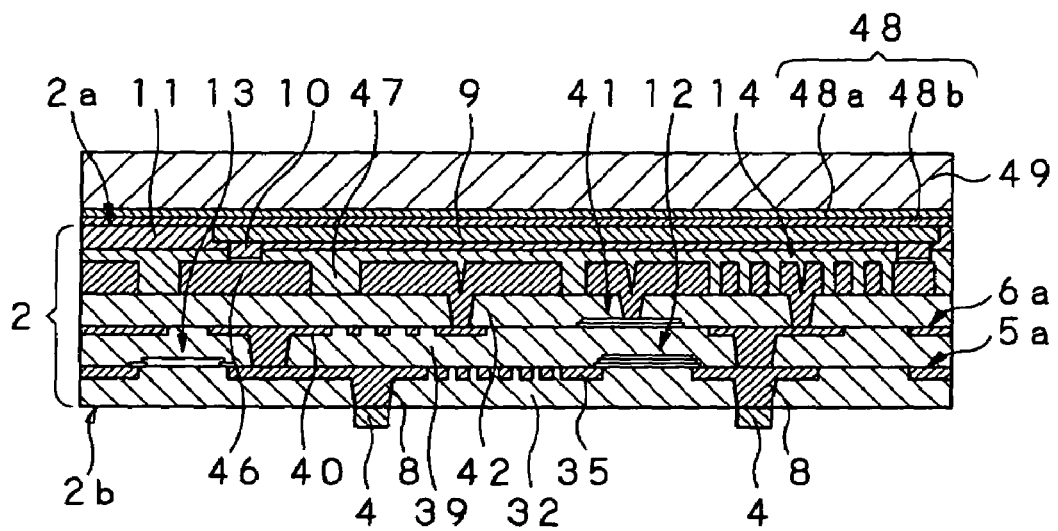
FIG. 27 illustrates a manufacturing process for a high frequency module device and depicts a longitudinal cross-sectional view showing the state in which bumps have been formed on the other major surface of the high frequency block unit.

The bump 4 by e.g., a solder is formed on the via 8 exposed on the other major surface 2b of the block unit 2, as shown in FIG. 27. The bump 4, operating as an electrical connecting unit in mounting the block unit 2 on the motherboard 3, may be formed as a nickel/copper plating layer by for example electrolytic plating or electroless plating. The block unit 2, having the dummy substrate 49 as a supporting substrate, is free of flexure, so that the bump 4 may be formed accurately on the other major surface 2b.

Figure 28:
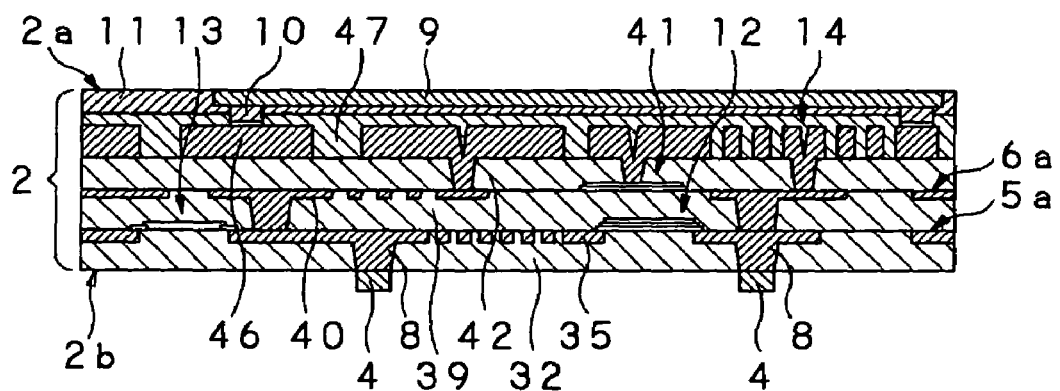
FIG. 28 illustrates a manufacturing process for a high frequency module device and depicts a longitudinal cross-sectional view showing the state in which the dummy substrate has been removed from one major surface of the high frequency block unit.

The dummy substrate 49 then is removed from the block unit 2 along with the release layer 48, as shown in FIG. 28. The dummy substrate 49 and the release layer 48 are removed from the one major surface 2a of the block unit 2 in the same way as when removing the dummy substrate 30 and the release layer 31 from the other major surface 2b of the block unit 2.

Figure 29:
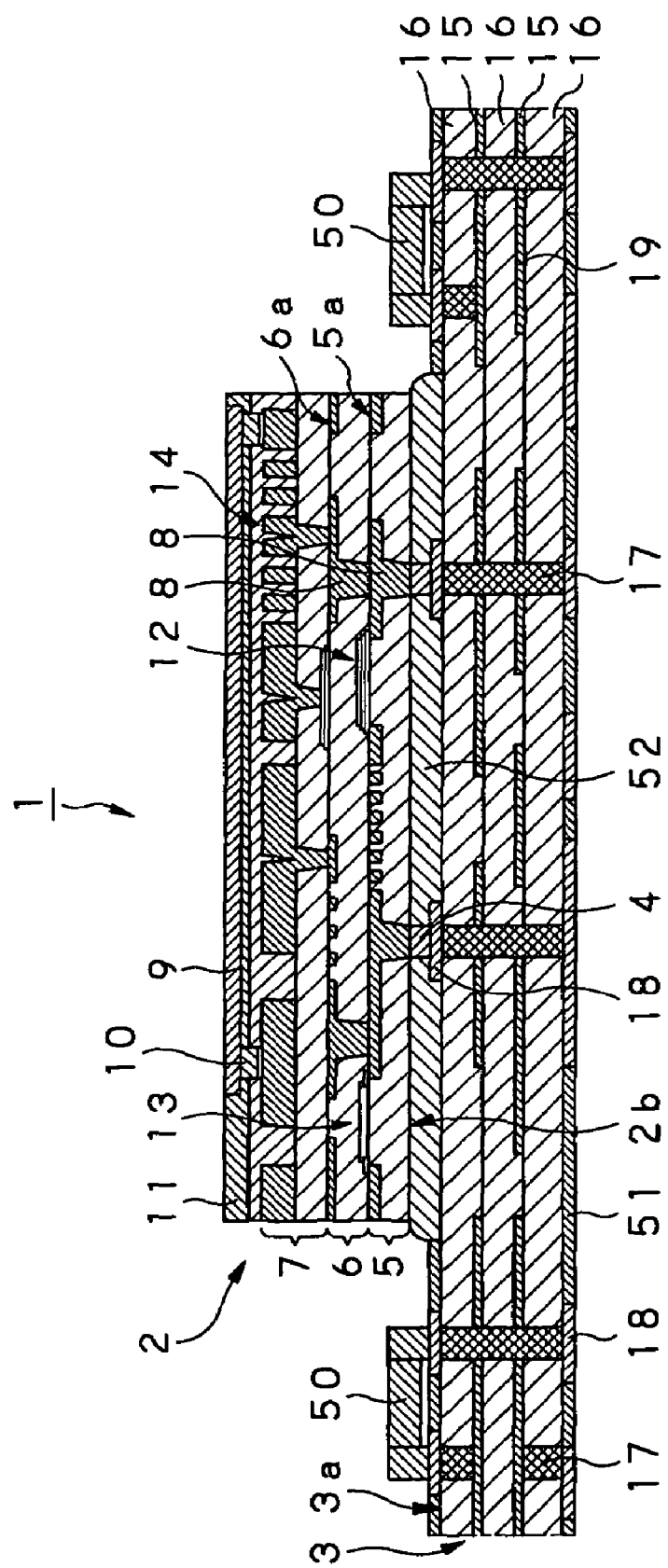
FIG. 29 illustrates a manufacturing process for a high frequency module device and depicts a longitudinal cross-sectional view showing the state in which the high frequency block unit has been mounted on the motherboard.

The block unit 2 then is mounted on the motherboard 3, with the other major surface 2b as a mounting surface, along with the other semiconductor chip 50, as shown in FIG. 29. The motherboard 3 includes a plural number of wiring layers 15, each having a grounding section 19 therein, and includes an input/output terminal unit 18 exposed from a protective layer 51, formed by e.g., a resist, on its major surface 3a, hereinafter referred to as a mounting surface, on which the block unit 2, etc., is mounted.

The block unit 2 is mounted on the motherboard 3 by being electrically connected via bump 4 to the input/output terminal unit 18 exposed from the mounting surface 3a of the motherboard 3. Specifically, an under-fill 52 is charged into a space between the motherboard 3 and the block unit 2, with the bump unit 4 facing the input/output terminal unit 18, and the resulting assembly is heated in for example a solder reflow vessel for electrically connecting the input/output terminal unit 18 and the bump unit 4 for mounting the block unit 2 on the mounting surface 3a of the motherboard 3. This completes the high frequency module device 1 formed by the block unit 2 and the motherboard 3.

In this high frequency module device 1, the block unit 2 is formed by sequentially layering the first unit wiring layer 5 to third unit wiring layer 7 on the dummy substrate 30 and by releasing the dummy substrate 30. The one major surface 5a of the first unit wiring layer 5 and the one major surface 6a of the second unit wiring layer 6 are planarized with high precision by the CMP method.

Thus, with the present high frequency module device 1, in which micro-irregularities may be prohibited from being formed on the one major surface 5a of the first unit wiring layer 5 and on the one major surface 6a of the second unit wiring layer 6, and the pattern wirings, vias and the passive device units may be formed with high precision, it is possible to improve high frequency characteristics as well as to achieve a higher density and a smaller area of the wiring. With this high frequency module device 1, since the block unit 2 is not in need of the base substrate, it is possible to reduce the size along the thickness and to lower the cost.

With the present high frequency module device 1, in which plural wiring layers 15, operating as wirings or grounding sections 19 for transmitting the power, control signals or the high frequency signals to the block unit 2, are provided within the motherboard 3, there is no necessity of providing a land for supplying the power to the vicinity of the block unit 2 on, for example, the mounting surface 3a of the motherboard 3, and in which the block unit 2 can be mounted directly above the input/output terminal unit 18, it is possible to reduce the area of the device.

With the present high frequency module device 1, in which the wiring layers 15 and the grounding sections 19 having a sufficient area are formed on the motherboard 3, it is possible to supply the power of high regulation to the block unit 2.

Figure 30:
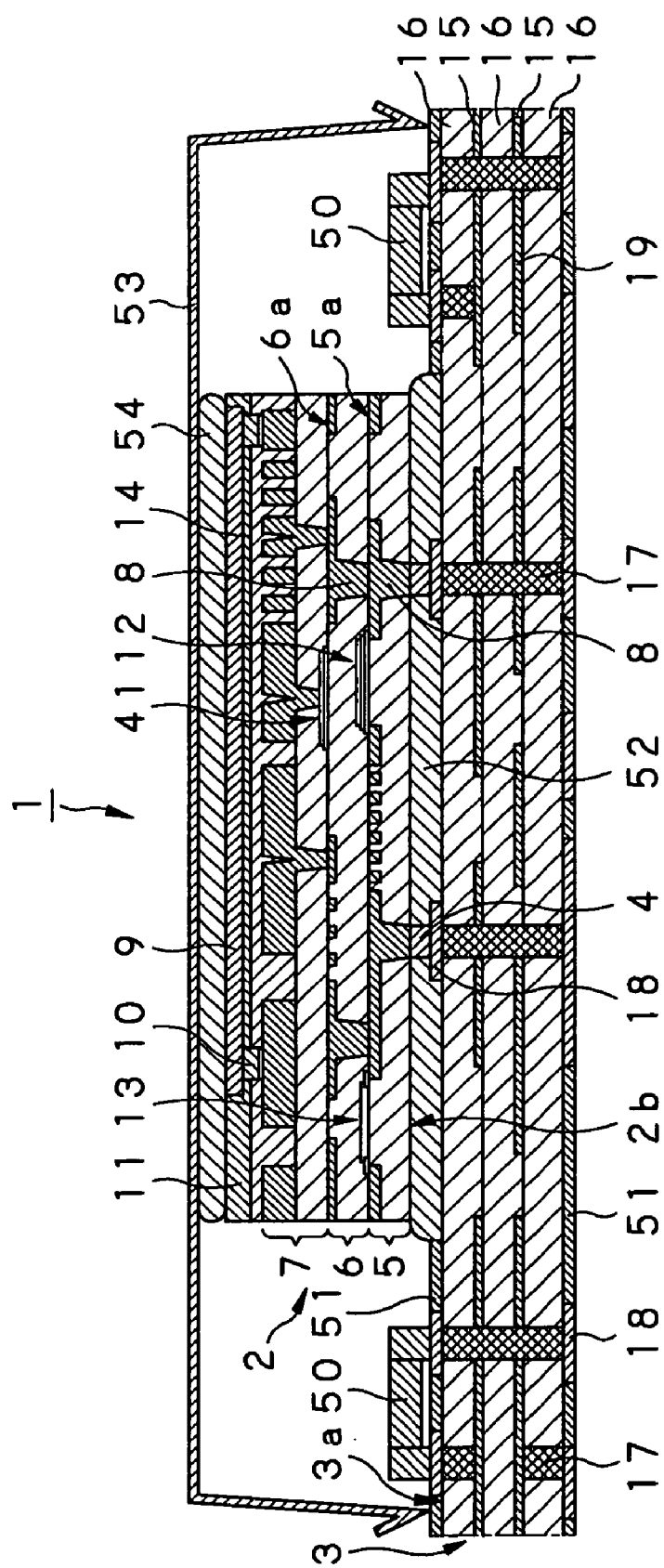
FIG. 30 is a longitudinal cross-sectional view showing the state in which a shield cover and a thermally conductive resin material have been mounted on the high frequency module substrate.

Moreover, with the present high frequency module device 1, a shield cover 53 for eliminating the effect of the electromagnetic noise is assembled to overlie the block unit 2 and the semiconductor chip 50 mounted via input/output terminal unit 18 on the mounting surface 3a of the motherboard 3, as described above, as shown in FIG. 30.

Thus, in the high frequency module device 1, in which the block unit 2 and the semiconductor chip 50 are covered by the shield cover 53, it is a frequent occurrence that the heat evolved from the functional devices 9 or the semiconductor chip 50 in the block unit 2 on the mounting surface 3a of the motherboard 3 be confined in the shield cover 53 to affect high frequency characteristics. Thus it is preferred to provide the high frequency module device 1 with a suitable heat radiating structure.

Thus, in the high frequency module device 1, a heat conductive resin material 54 is charged into a space between the one major surface 2a of the block unit 2 and the shield cover 53 to form the heat radiating structure. In the high frequency module device 1, the heat evolved from the functional devices 9 of the block unit 2 may be transmitted through the heat conductive resin material 54 to the shield cover 53, this shield cover 53 operating as a heat radiating section to prevent the heat from being confined in the inside of the shield cover 53 to affect the high frequency characteristics. Meanwhile, in the high frequency module device 1, the block unit 2 is held by the heat conductive resin material 54 and the shield cover 53 to improve the mechanical mounting toughness.

Figure 31:
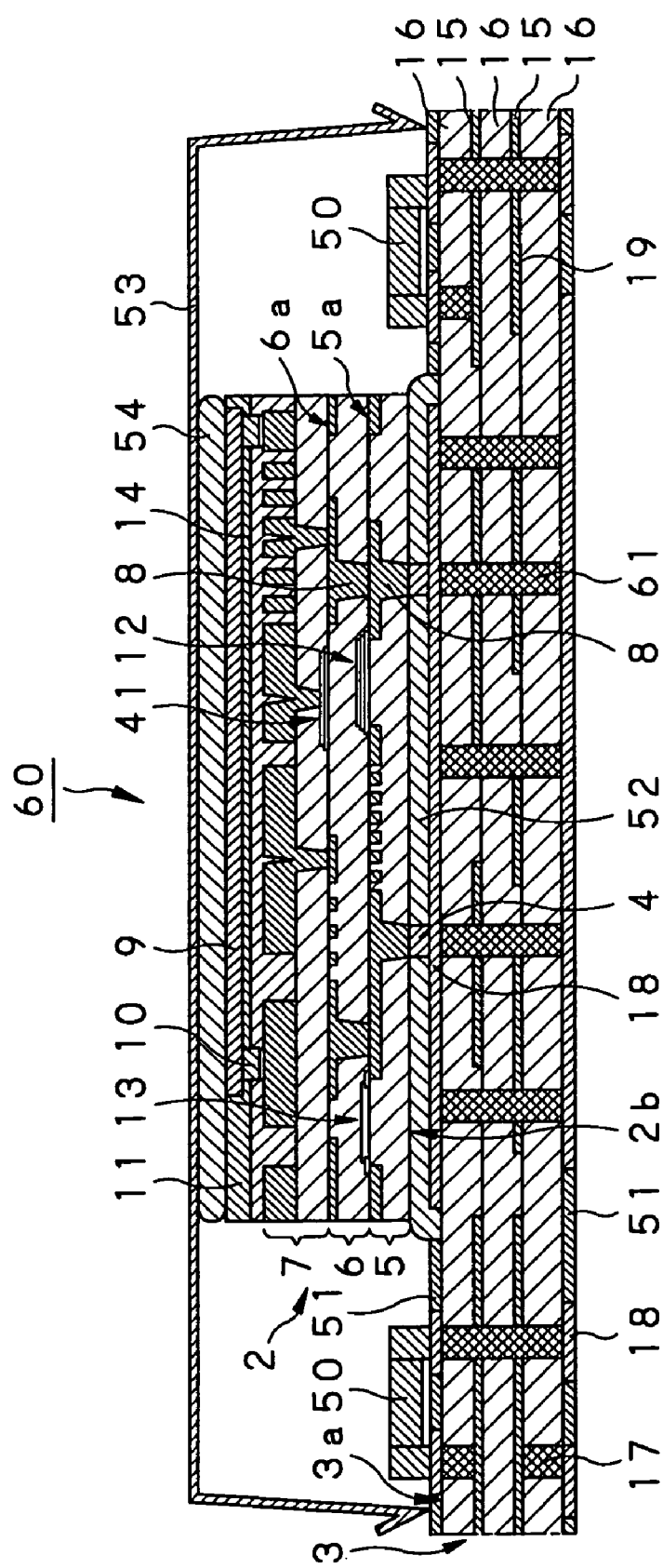
FIG. 31 is a longitudinal cross-sectional view showing the state in which a cooling via has been formed in the interior of a motherboard in the high frequency module substrate.

In a high frequency module device 60, shown in FIG. 31, the heat evolved from the block unit 2 and the semiconductor chip 50 is designed to be radiated more efficiently. In addition to the heat conductive resin material 54, numerous cooling vias 61, communicating with the inside of the motherboard 3, are formed in register with the loading region of the block unit 2. These cooling vias 61 are formed by a process similar to the process used for forming the via-holes 17 in the motherboard 3.

In the high frequency module device 60, the heat evolved from the functional devices 9 of the block unit 2 is radiated from the shield cover 53 through the heat conductive resin material 54, while being transmitted to the bottom surface of the motherboard 3 through the cooling vias 61 so as to be radiated to outside. In the high frequency module device 60, efficient heat radiation is achieved by heat radiation from the block unit 2 and the motherboard 3. Meanwhile, the heat radiating structure for the high frequency module device 60 may be formed solely by the cooling vias 61. With the high frequency module device 60, the wiring layer 62 provided on for example the motherboard 3 may be of an increased thickness of, for example, 50 nm, with the cooling vias 61 being connected to the wiring layer 62 for effecting heat radiation from the wiring layer 62.

Figure 32:
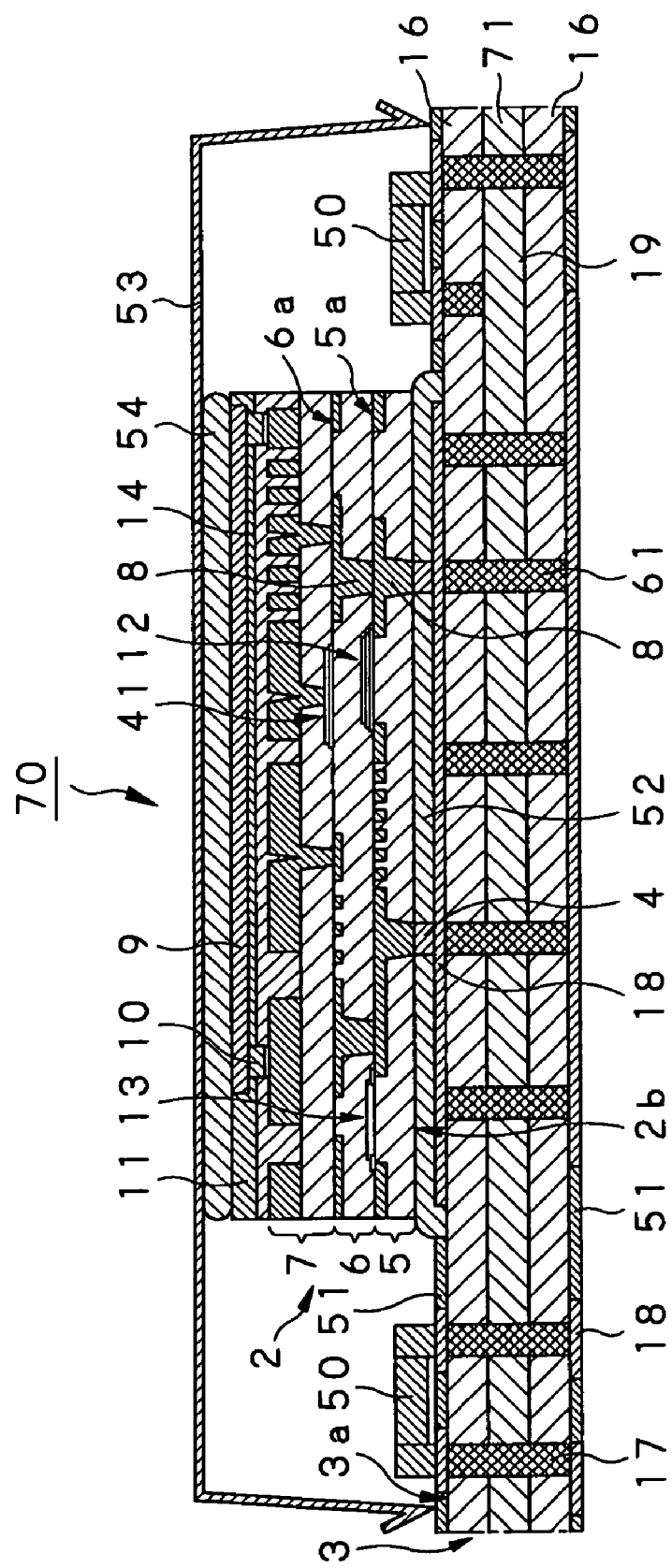
FIG. 32 is a longitudinal cross-sectional view showing the state in which a metal core is provided in the interior of the motherboard in the high frequency module device.

In a high frequency module device 70, shown in FIG. 32, a metal core 71 of a metal having high electrical conductivity, such as copper or copper alloys, is provided within the motherboard 3. In the high frequency module device 70, the aforementioned numerous cooling vias 61 are connected to this metal core 71. In the high frequency module device 70, heat may be radiated from the metal core 71 through the cooling vias 61. By the structure of the heat conductive resin material 54 and the cooling vias 61, more efficient heat radiation may be achieved to improve the reliability.

The present invention is not limited to the above-described embodiments and, as may be apparent to those skilled in the art, various changes, substitutions or equivalents may be envisaged without departing from the scope and the purport of the invention as defined in the appended claims.

INDUSTRIAL APPLICABILITY

According to the present invention, the high frequency module device is manufactured by layering a plural number of unit wiring layers, each formed by an insulating layer and a wiring layer, planarizing the major surfaces of the respective unit wiring layers in their entirety, by peeling off the plural unit wiring layers from the dummy substrate to form a high frequency circuit block unit and by mounting the so produced high frequency circuit block unit on the motherboard.

Thus, according to the present invention such a high frequency module device may be produced in which microirregularities may be prevented from being formed on the major surfaces of the respective unit wiring layers of the high frequency circuit block unit, the passive devices or the wiring sections layered on the respective unit wiring layers may be formed to high accuracy and in which the high frequency circuit block unit obtained on layering on a dummy substrate and then peeling off the dummy substrate is mounted on the motherboard in a state not in need of a base substrate, thereby achieving reduction is size and cost.

According to the present invention, the wiring section or the grounding section for transmitting the power, control signals or the high frequency signals to the high frequency circuit block unit is provided within the interior of the motherboard, while the high frequency circuit block unit is not in need of the base substrate, the high frequency circuit block unit may be mounted directly above the connection section of the motherboard, thus allowing area reduction of the high frequency module device.

The invention claimed is:

1. A high frequency circuit block unit comprising:
a plurality of unit wiring layers stacked in a first direction and each being comprised of a wiring layer for transmitting information and an insulating layer, each unit wiring layer having a planarized surface, wherein the plurality of unit wiring layers are connected to one another through connecting vias and wherein at least one via is formed directly over a via of an adjacent layer to form a via-on-via structure; and
one or more semiconductor chips disposed over a surface of an upper-most unit wiring layer; and
a resin disposed to encapsulate said semiconductor chips; and
passive device units; and
one or more inductors formed on the upper-most unit wiring layer; and
bumps formed on a portion of one or more vias exposed from the lower-most unit wiring layer.

2. A high frequency module device comprising:
a motherboard and a high frequency circuit block unit, the high-frequency circuit block unit comprising:
a plurality of unit wiring layers stacked in a first direction and each being comprised of a wiring layer and an insulating layer, each unit wiring layer having a planarized surface, wherein the plurality of unit wiring layers are connected to one another through connecting vias; and
one or more semiconductor chips disposed over a surface of an upper-most unit wiring layer; and
a resin disposed to encapsulate said semiconductor chips; and
passive device units; and
one or more inductors formed on the upper-most unit wiring layer; and
bumps formed on a portion of one or more vias exposed from the lower-most unit wiring layer for interfacing with said motherboard;
and wherein said motherboard comprises cooling vias for improving the transfer of heat out of the high frequency circuit block unit.

3. A high frequency module device comprising:
a high frequency circuit block unit, the high-frequency circuit block unit being comprised of: a plurality of unit wiring layers stacked in a first direction and each being comprised of a wiring layer and an insulating layer, each unit wiring layer having a planarized surface, wherein the plurality of unit wiring layers are connected to one another through connecting vias; and
one or more semiconductor chips disposed over a surface of an upper-most unit wiring layer; and
a resin disposed to encapsulate said semiconductor chips; and
passive device units; and
one or more inductors formed on the upper-most unit wiring layer; and
bumps formed on a portion of one or more vias exposed from the lower-most unit wiring layer, and wherein said high frequency module device is further comprised of:
a motherboard for interfacing with the high frequency circuit block unit, said motherboard comprising:
motherboard cooling vias disposed in such as manner as to connect with one or more of the bumps exposed from the lower-most unit wiring layer of the high frequency circuit block unit, and
a metal core that interfaces with one or more of the motherboard cooling vias in order to facilitate further transmission of heat away from the high frequency circuit block unit.

4. The high frequency module device according to claim 2, wherein said cooling vias are electrically non-functional.

5. A high frequency circuit block unit comprising:
a plurality of unit wiring layers stacked in a first direction and each being comprised of a wiring layer and an insulating layer, each unit wiring layer having a planarized surface, wherein the plurality of unit wiring layers are connected to one another through connecting vias and wherein at least one via is formed directly over a via of an adjacent layer to form a via-on-via structure; and
one or more semiconductor chips disposed over a surface of an upper-most unit wiring layer; and
a resin disposed to encapsulate said semiconductor chips; and
passive device units; and
one or more inductors formed on the upper-most unit wiring layer; and
bumps formed on a portion of one or more vias exposed from the lower-most unit wiring layer; and
wherein the wiring layers connected by the via-on-via structure are not ground planes.

6. A high frequency circuit block unit comprising:
a plurality of unit wiring layers stacked in a first direction and each being comprised of a wiring layer and an insulating layer, each unit wiring layer having a planarized surface, wherein the plurality of unit wiring layers are connected to one another through connecting vias and wherein at least one via is formed directly over a via of an adjacent layer to form a via-on-via structure; and
one or more semiconductor chips disposed over a surface of an upper-most unit wiring layer; and
a resin disposed to encapsulate said semiconductor chips; and
passive device units; and
one or more inductors formed on the upper-most unit wiring layer; and
bumps formed on a portion of one or more vias exposed from the lower-most unit wiring layer; and
wherein the via-on-via structure connects an upper and lower wiring layer, the upper wiring layer is formed below an uppermost surface of the high frequency circuit block, and the lower wiring layer is formed above a lowermost surface of the high frequency circuit block.

* * * * *